(12) United States Patent
Louie et al.

(10) Patent No.: US 9,236,128 B1
(45) Date of Patent: Jan. 12, 2016

(54) VOLTAGE KICK TO NON-SELECTED WORD LINE DURING PROGRAMMING

(71) Applicant: SanDisk Technologies, Inc., Plano, TX (US)

(72) Inventors: Kenneth Louie, Sunnyvale, CA (US); Khanh Nguyen, Fremont, CA (US); Man Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/612,010

(22) Filed: Feb. 2, 2015

(51) Int. Cl.
*G11C 16/04* (2006.01)
*G11C 16/10* (2006.01)
*G11C 16/08* (2006.01)
*G11C 16/16* (2006.01)
*G11C 16/26* (2006.01)

(52) U.S. Cl.
CPC ............ *G11C 16/0483* (2013.01); *G11C 16/08* (2013.01); *G11C 16/10* (2013.01); *G11C 16/16* (2013.01); *G11C 16/26* (2013.01)

(58) Field of Classification Search
CPC ........ G11C 16/08; G11C 16/10; G11C 16/16; G11C 16/26; G11C 16/0483
USPC ............. 365/185.11, 185.05, 185.23, 185.17, 365/230.03, 230.06
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,289,365 B2 * | 10/2007 | Shuto | G11C 8/08 365/185.14 |
| 7,518,920 B2 * | 4/2009 | Kang | G11C 11/5621 365/185.17 |
| 7,518,921 B2 * | 4/2009 | Maejima et al. | H01L 27/0203 365/185.17 |
| 7,630,244 B2 * | 12/2009 | Lee | G11C 16/14 365/185.17 |
| 8,874,825 B2 * | 10/2014 | Alrod et al. | G06F 11/1068 365/185.11 |
| 8,902,661 B1 * | 12/2014 | Raghu et al. | G11C 16/10 365/185.05 |
| 2005/0237829 A1 | 10/2005 | Nakamura et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Pho M Luu
(74) *Attorney, Agent, or Firm* — Davis Wright Tremaine LLP

(57) ABSTRACT

When applying a programming voltage at one end of a word line of a non-volatile memory circuit, if the word line has a large RC constant the far end of the word line will not rise as fast as the driven end, which can adversely affect device performance. To more quickly raise the voltage on the selected word line, a voltage kick is applied to non-selected word lines, such as dummy word lines, by way of a non-selected sub-block of the selected block. The channel of NAND strings in the non-selected sub-block is used to transfer the kick to the far end of the selected word line of the selected sub-block.

14 Claims, 34 Drawing Sheets

(56) References Cited

U.S. PATENT DOCUMENTS

| | | |
|---|---|---|
| 2005/0267699 A1 | 12/2005 | Claseman |
| 2006/0268609 A1 | 11/2006 | Kim et al. |
| 2007/0252201 A1 | 11/2007 | Kito et al. |
| 2008/0209150 A1 | 8/2008 | Byeon |
| 2010/0174845 A1 | 7/2010 | Gorobets et al. |
| 2010/0322000 A1 | 12/2010 | Shim et al. |
| 2011/0128788 A1 | 6/2011 | Honda |
| 2012/0220088 A1 | 8/2012 | Alsmeier |
| 2013/0107628 A1 | 5/2013 | Dong et al. |
| 2014/0003157 A1 | 1/2014 | Mui et al. |
| 2014/0047163 A1 | 2/2014 | Kwak |
| 2014/0169095 A1 | 6/2014 | Avila et al. |
| 2014/0254267 A1 | 9/2014 | Sakui et al. |

OTHER PUBLICATIONS

U.S. Appl. No. 13/927,659, filed Jun. 26, 2013, 41 pages.
U.S. Appl. No. 13/925,662 filed Jun. 24, 2013, 36 pages.

* cited by examiner

Programming into four states represented by a 2-bit code

VOLTAGE KICK TO NON-SELECTED WORD LINE DURING PROGRAMMING

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

A non-volatile memory circuit includes an array having a plurality of blocks formed according to a NAND type of architecture of a plurality of non-volatile memory cells formed along word lines and connected in series between select gates. Each of the blocks has a plurality of sub-blocks, where individual word line portions of the sub-blocks of the same word line of the same block are commonly connected and the select gates of control gates of sub-blocks are connected independently of the select gates of other sub-blocks of the same block. Driver circuitry is connectable to the word lines and the select gates to provide programming voltage levels thereto, wherein the driver circuitry is connectable at a first, but not a second, end of each of the word lines, and wherein at the second end the thereof each of the individual word line portions of sub-blocks of the same word line of a block are commonly connected. The driver circuitry is connectable to the word lines and the select gates by decoding circuitry. On-chip control circuitry is connected to the driver circuit and decoder circuitry, whereby when performing a programming operation for memory cells on a selected word line for a selected sub-block of a selected block an initial block biasing operation of the selected block is performed in which select gates of non-selected sub-blocks of the selected block are biased to be off and non-selected word lines of the selected block are biased to one of one or more pass voltages, except for a first set of one or more non-selected word lines that are set to a first voltage level, wherein the pass voltages are sufficient to allow a memory cell to conduct independently of a data state written thereto and wherein the first voltage will allow a memory cell to conduct for some but not all data states programmable thereto. With the selected block biased according to the initial biasing operation, applying a programming pulse to the selected word line and, while applying the programming pulse, raising the voltage level on one or more of the first set of word lines from the first voltage to a pass voltage.

A is presented for performing a programming operation for memory cells on a selected word line for a selected sub-block of a selected block of a non-volatile memory circuit. The memory circuit has an array having of a plurality of blocks formed according to a NAND type of architecture of a plurality of non-volatile memory cells formed along word lines and connected in series between select gates, each of the blocks having a plurality of sub-blocks, where individual word line portions of the sub-blocks of the same word line of the same block are commonly connected and the select gates of control gates of sub-blocks are connected independently of the select gates of other sub-blocks of the same block. Driver circuitry is connectable to the word lines and the select gates to provide programming voltage levels thereto, wherein the driver circuitry is connectable at a first, but not a second, end of each of the word lines, and wherein at the second end the thereof each of the individual word line portions of sub-blocks of the same word line of a block are commonly connected. The method includes performing an initial block biasing operation of the selected block; with the selected block biased according to the initial biasing operation, applying a programming pulse to the selected word line from the first end thereof; and while applying the programming pulse, raising the voltage level on one or more of the first set of word lines from the first voltage to a pass voltage. The initial block biasing operation of the selected block includes: biasing select gates of non-selected sub-blocks of the selected block to be off; and driving from the first end thereof non-selected word lines of the selected block, where the non-selected word lines of the selected block are biased to one of one or more pass voltages, except for a first set of one or more non-selected word lines that are set to a first voltage level. The pass voltages are sufficient to allow a memory cell to conduct independently of a data state written thereto and the first voltage will allow a memory cell to conduct for some but not all data states programmable thereto.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
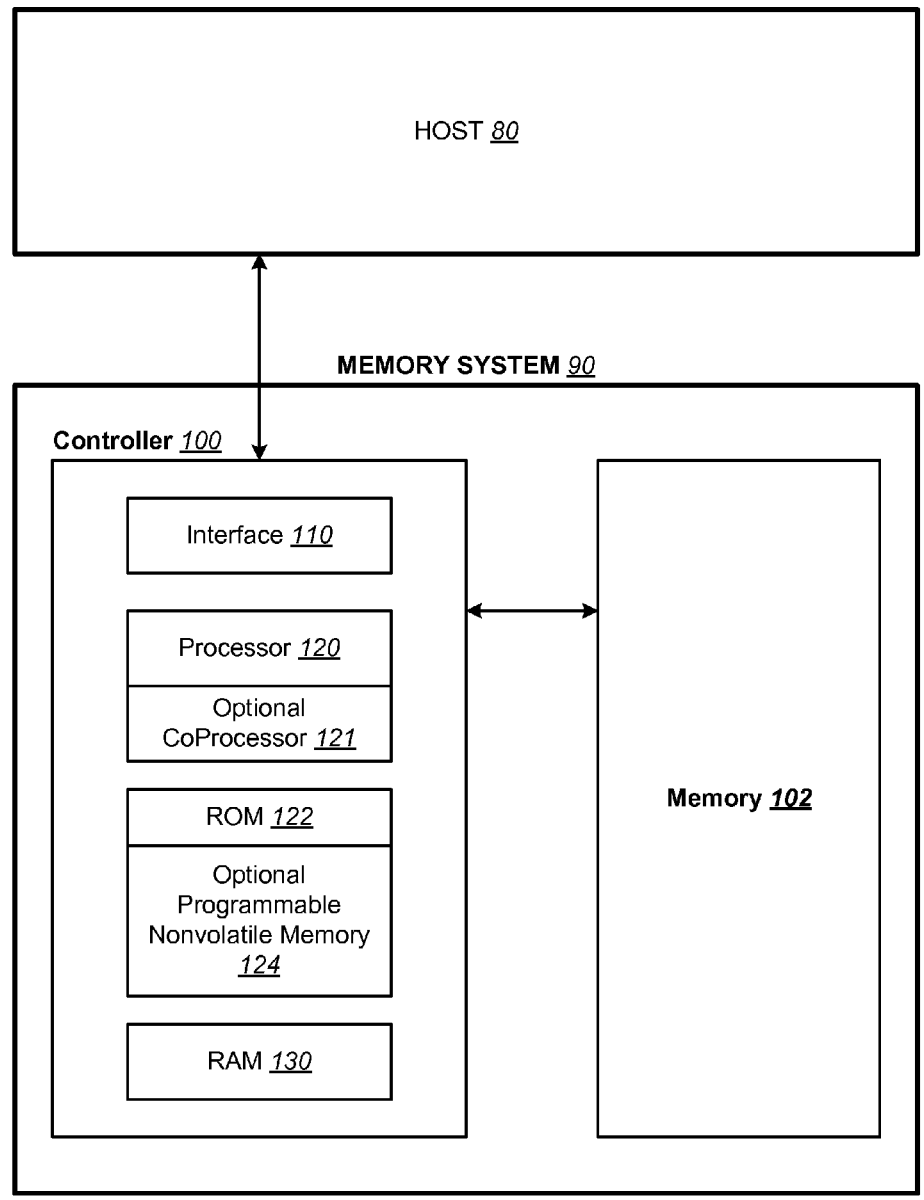
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
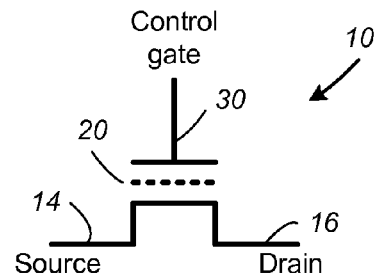
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
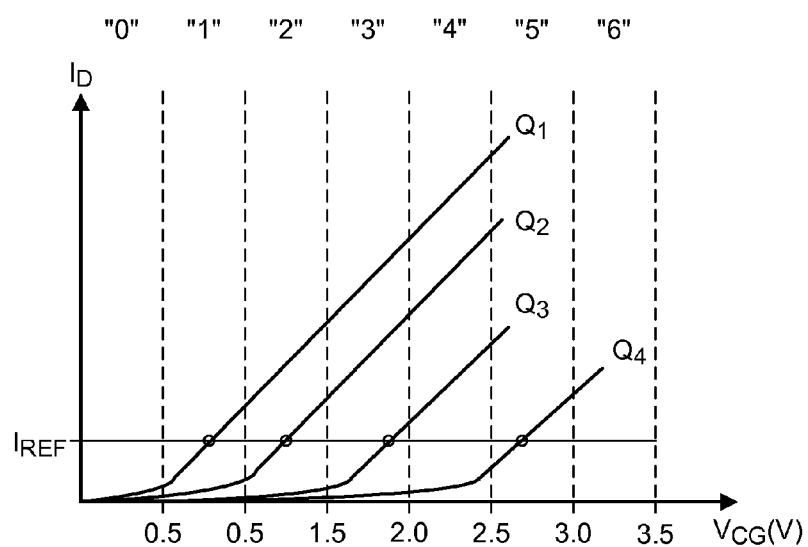
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, TREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
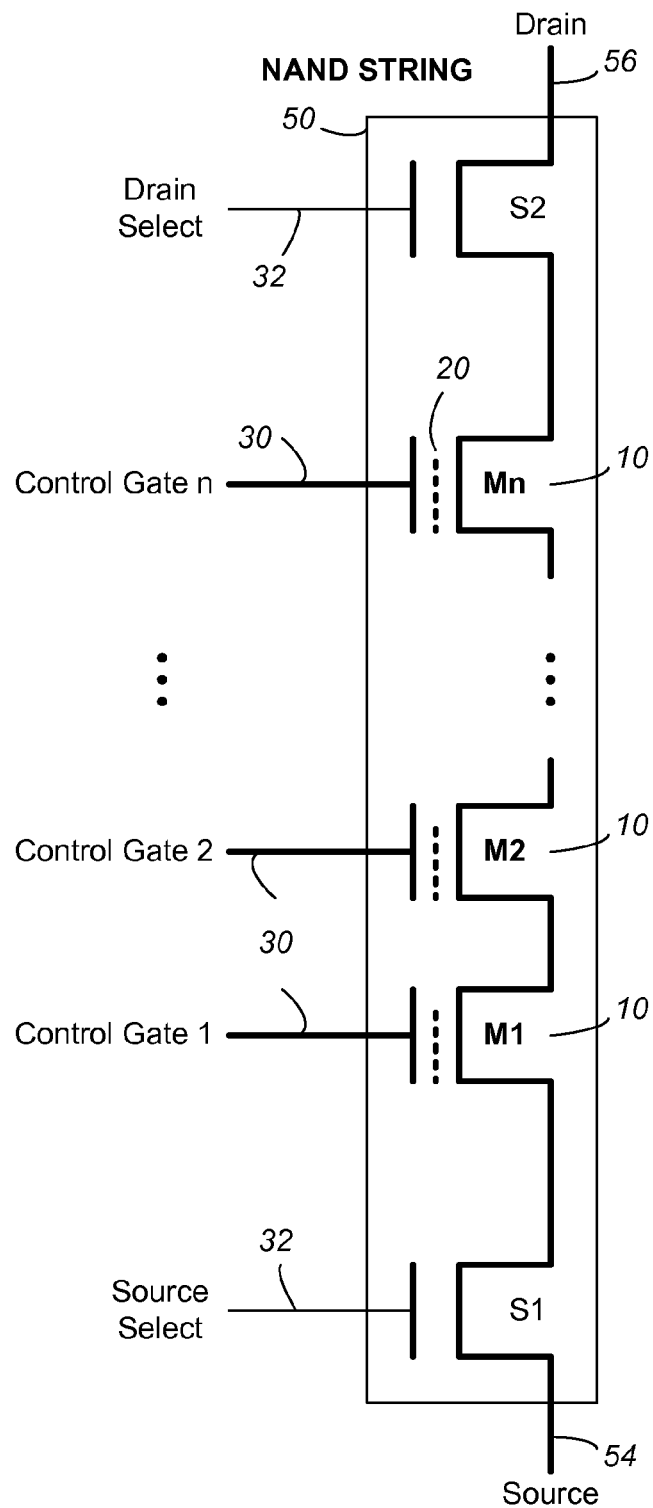
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
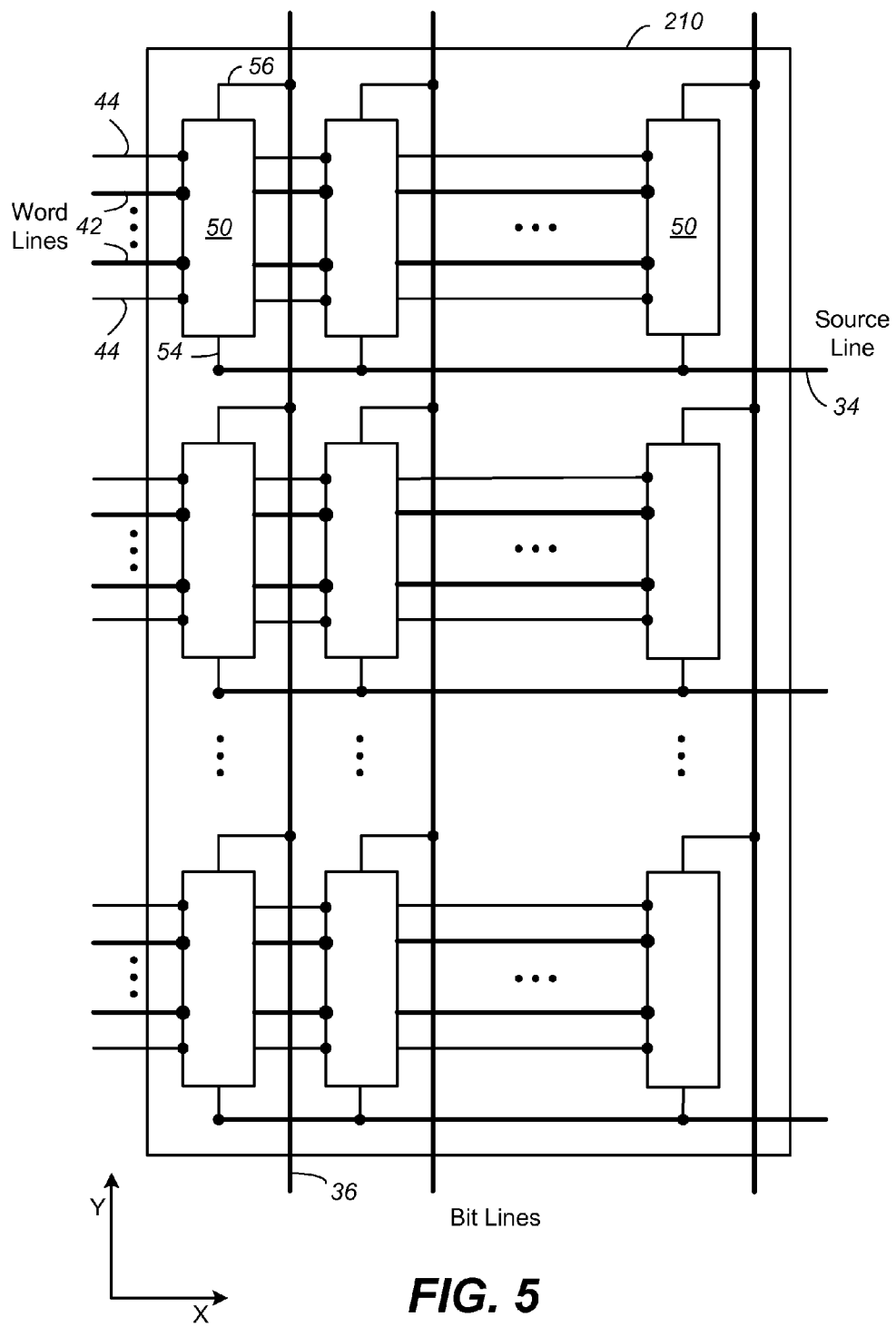
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
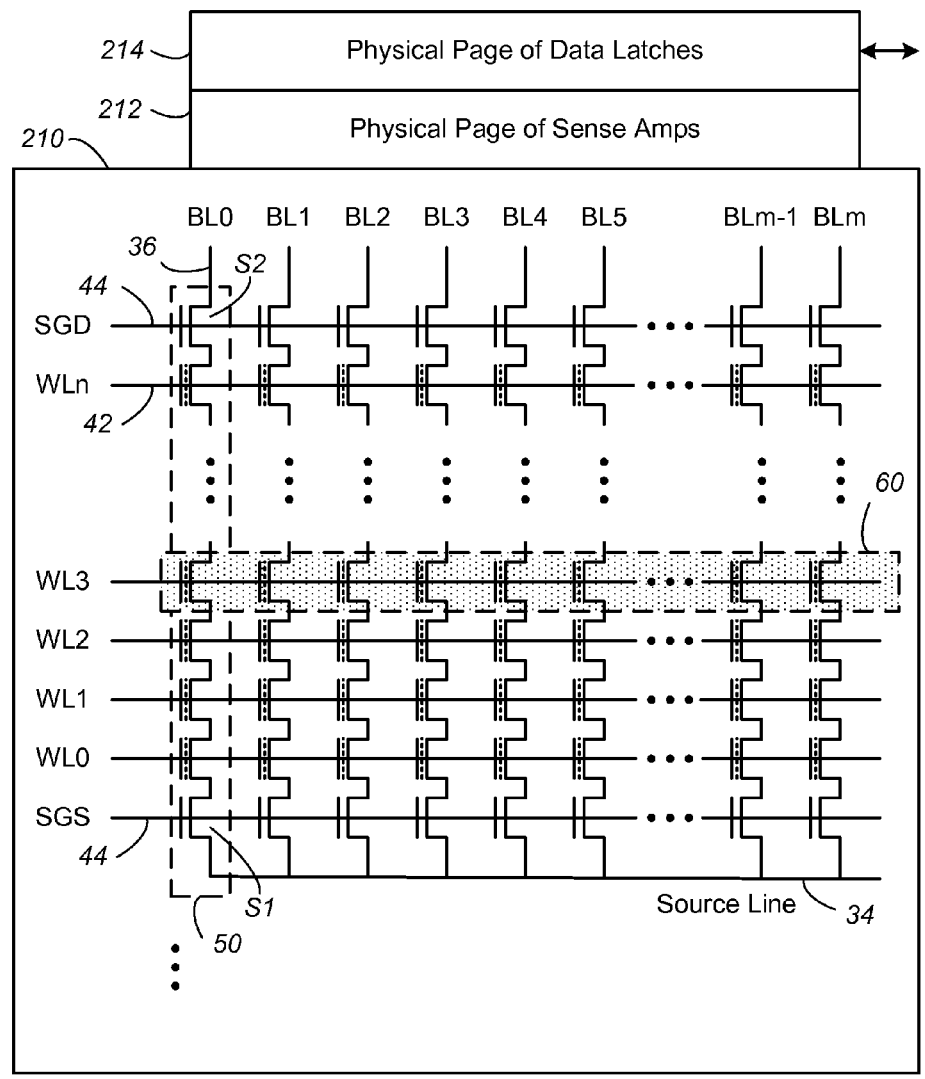
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
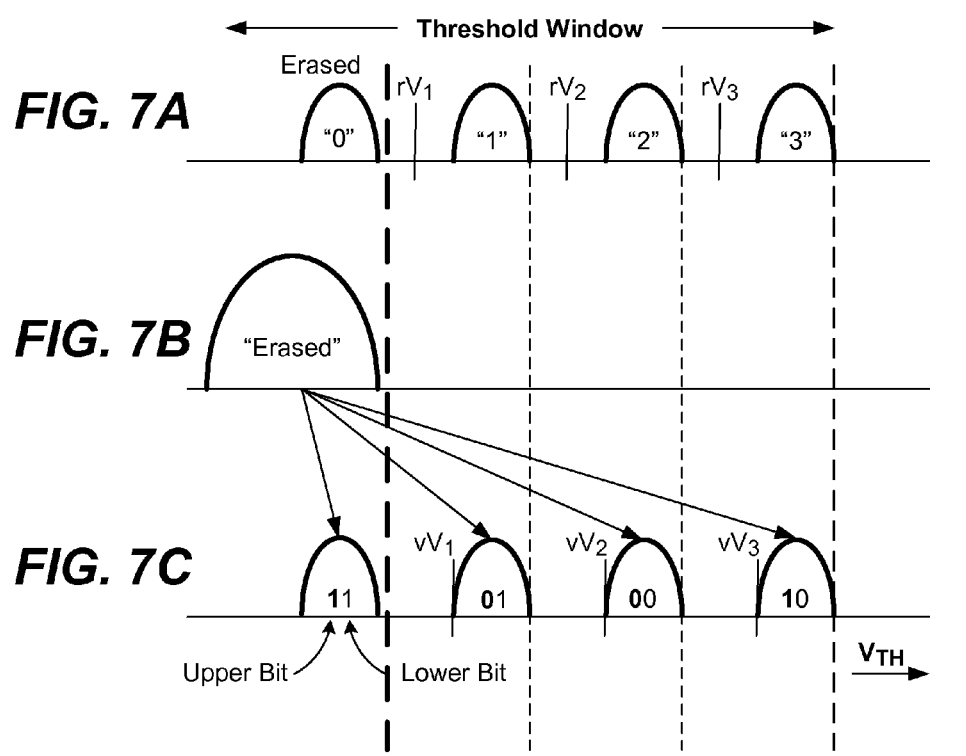
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
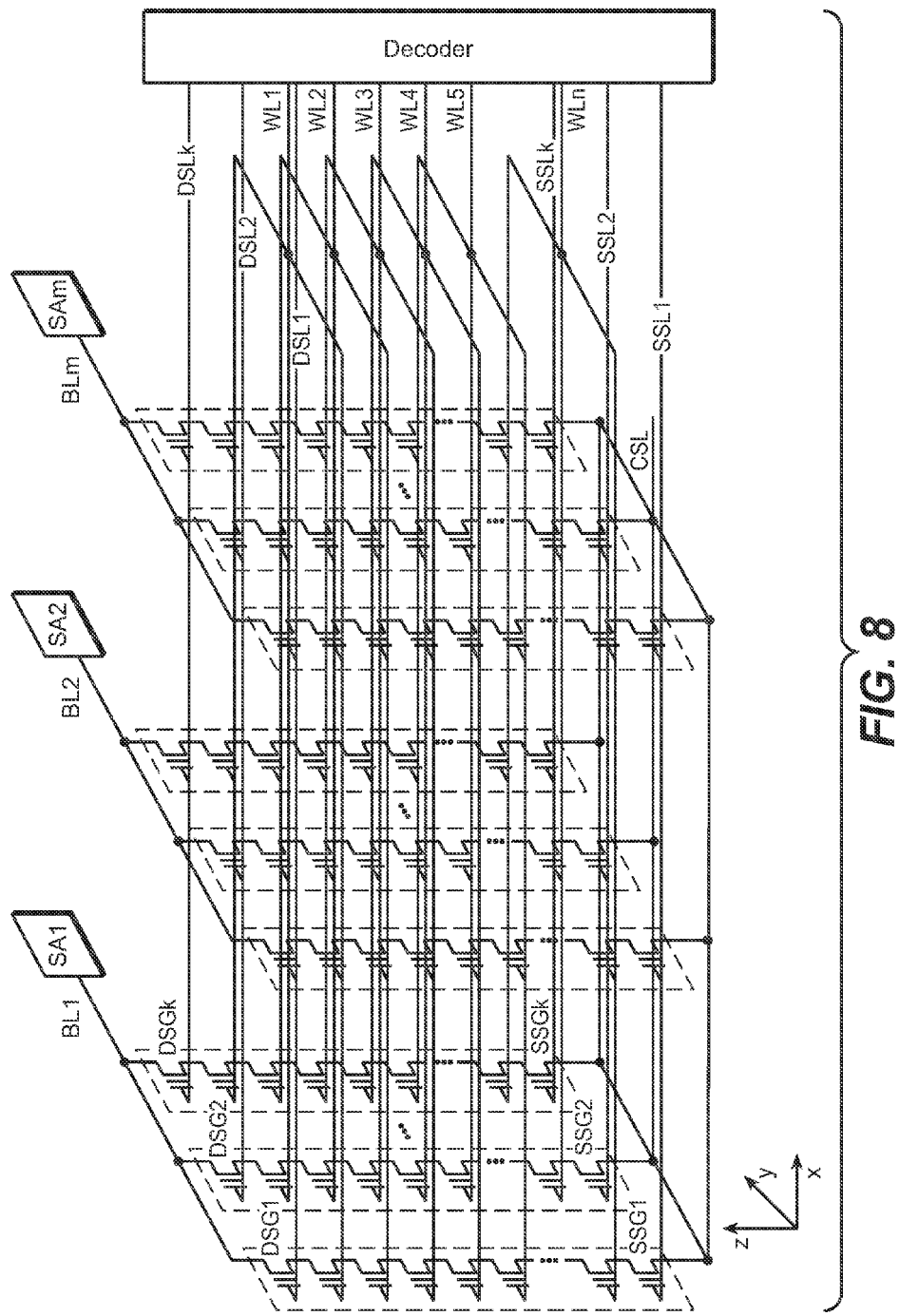
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-m, each run across the top to an associated sense amp SA1-m. The word lines, WL1-n, and source and select lines SSL1-n and DSL1-n, then run in x direction, with the NAND string connected at bottom to a common source line CSL.

Figure 9:
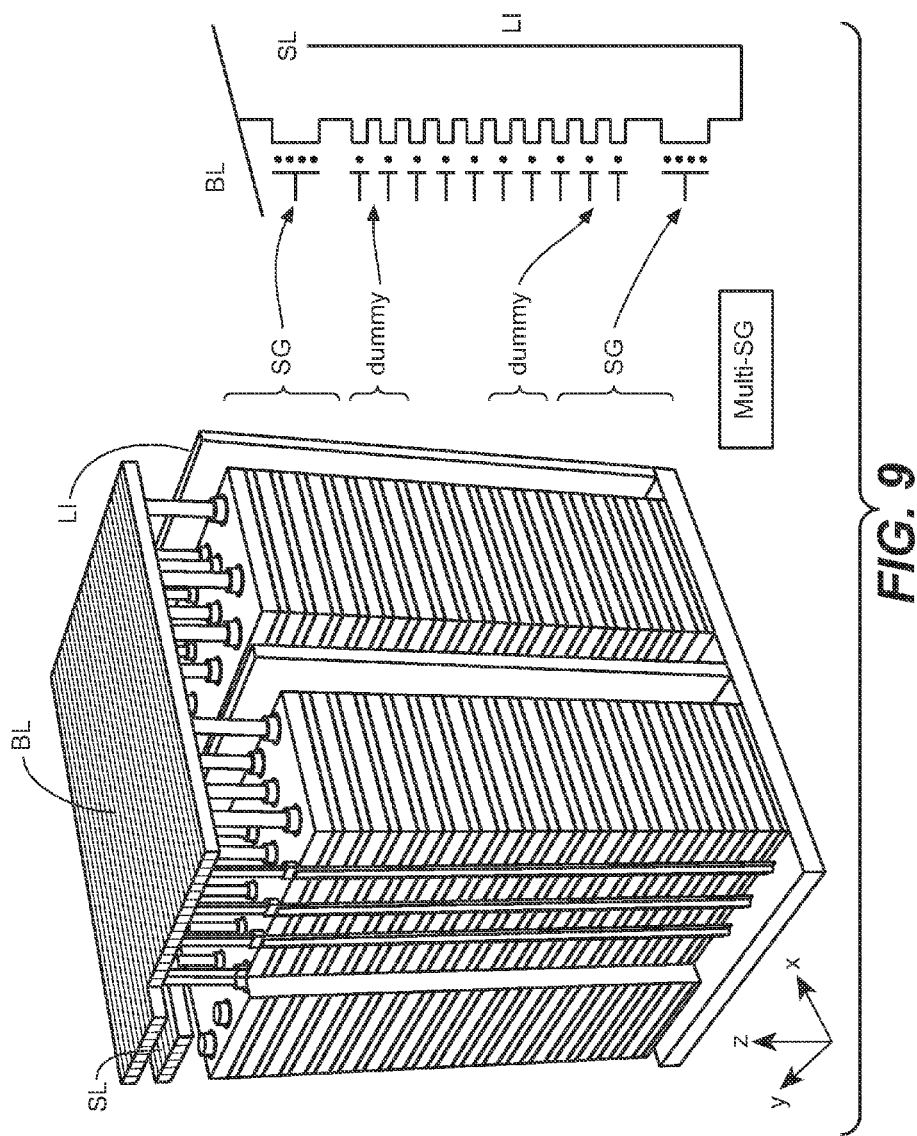
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series, making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
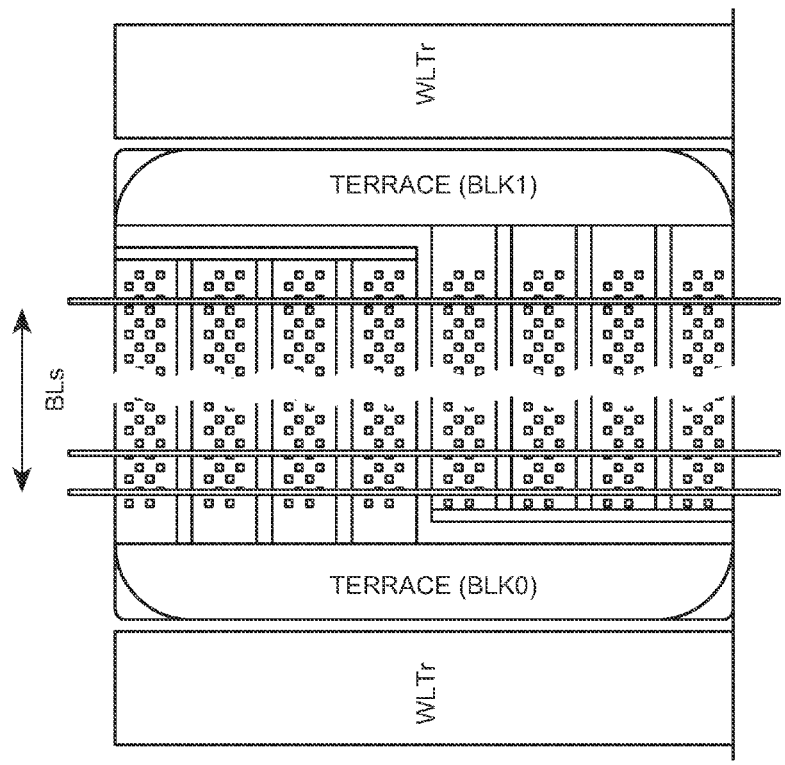

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
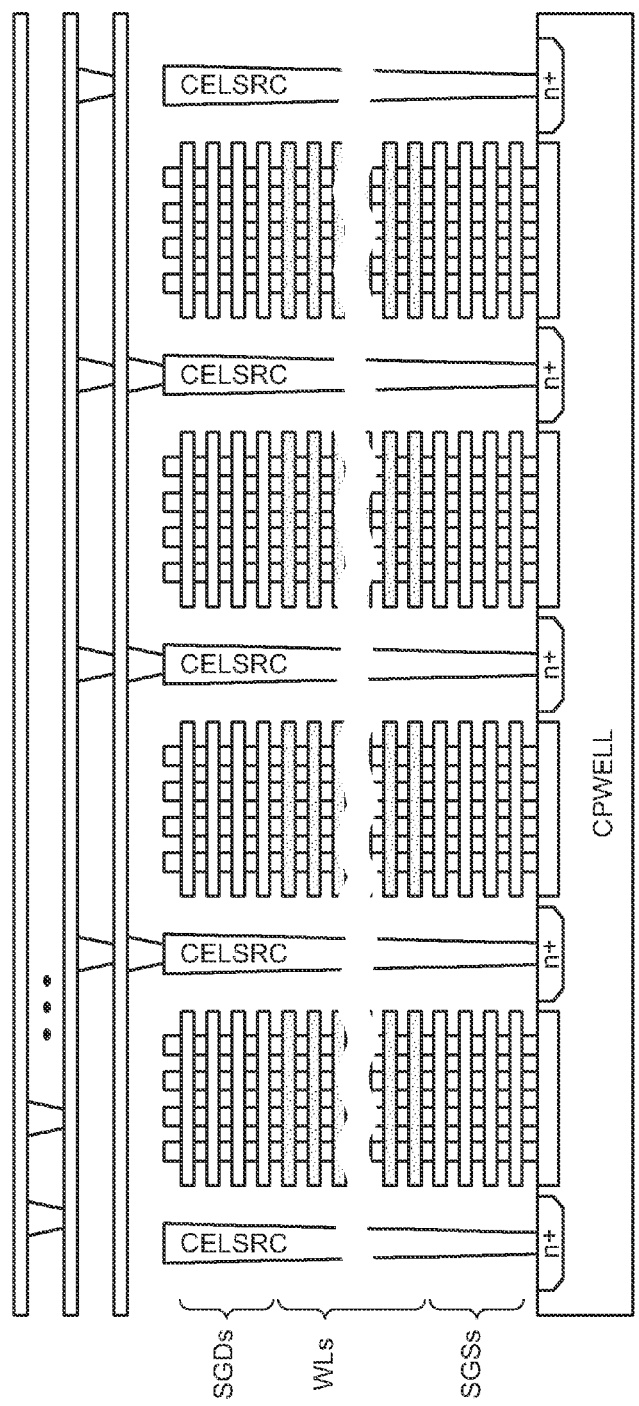

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
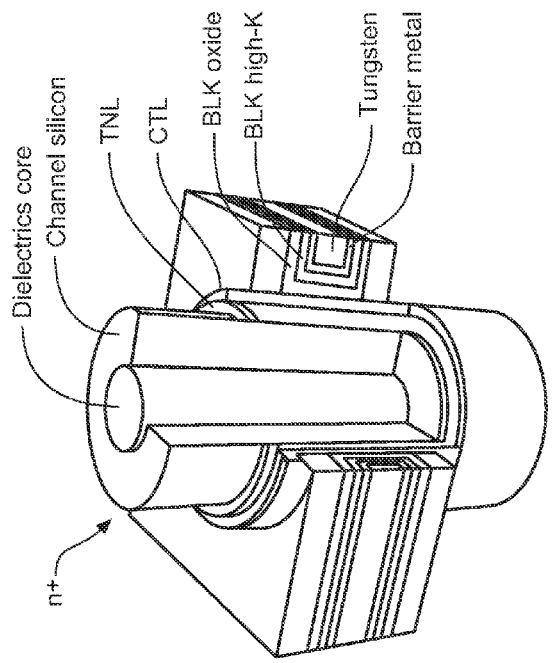

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Block Segmentation for Faster Bit Line Settling/Recovery

In memory arrays, such as those described above, memory cells are typically formed along word lines and bit lines. FIGS. 5 and 10 show some examples of array structures where the NAND strings of memory cells are connected along global bit lines running across the array. These bit lines span multiple blocks or, typically, an entire plane. Sensing and other operations often require that bit lines be set to a particular voltage level. Blocks nearer to the sense amplifier circuits see a faster bit line settling/recover time compared to blocks further from the sense amps. This is because the far side blocks sees a huge bit line resistance and have an IR drop across it. Thus, the far side bit line level will be less compared to near side. As the far side bit line level is less compared to near blocks, it strongly couples its neighbor bit lines, taking more time to settle/recover. Consequently, far side blocks have and thus we see slower performance and also burn more current as current is flowing for a longer time until the BL settles/recovers. To avoid error, the memory device would set timings based on the slowest blocks, requiring more time and current than needed for the faster, nearer blocks.

Figure 13:
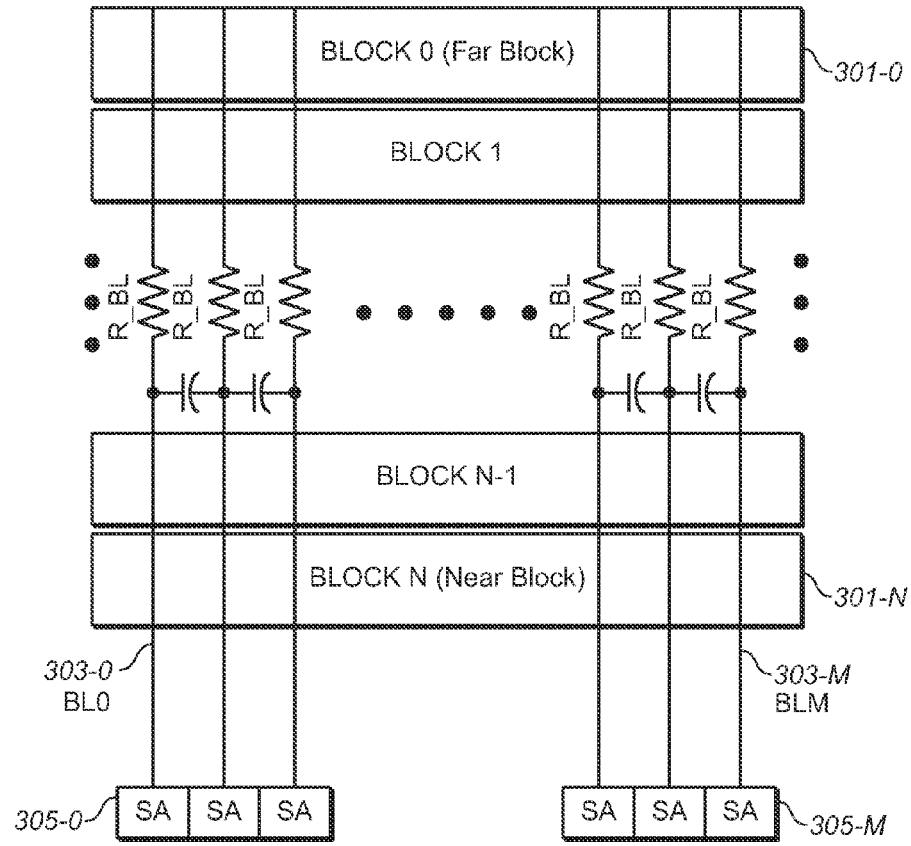
FIG. 13 shows an array of blocks spanned by set of bit lines each connected to a corresponding sense amp.
Figure 14:
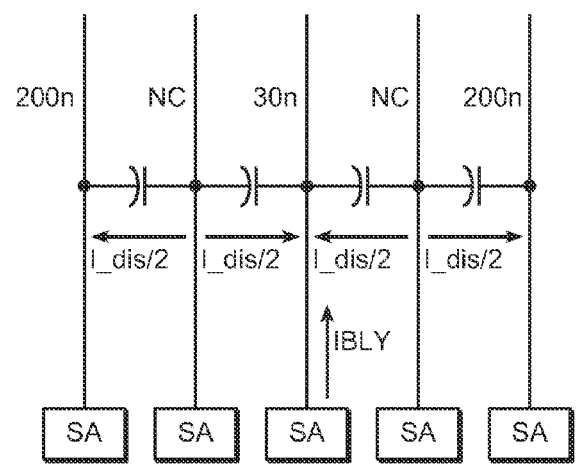
FIG. 14 looks at a problematical bit line pattern with respect to settling times.

The situation can be illustrated by FIG. 13 that shows an array of N+1 blocks, where N can run into the hundreds or thousands. A set of bit lines BL0 to BLM, 303-0 to 303-M spans the blocks and are each connected to a corresponding sense amp SA 305-0 to 305-M. FIG. 13 shows one bit line per sense amp, but in other arrangements where less than all of the bit lines are selected concurrently (as where only every other or every fourth bit line is sensed together). The resistance along the bit lines between the near (to the sense amps) and far blocks is represented schematically as R_BL and the inter-bit line capacitance is also shown. This resistance along the bit lines and the inter-bit line capacitance can result to significant differences in settling times between the nearest block 301-N and the farthest block 301-0. FIG. 14 considers this situation further.

A sensing operation can be of the lock out type or no lock out type. When reading multi-state data, such as illustrated above with respect to FIG. 7A-7C, the memory typically starts with the lowest state and works its way up through the higher states. Once a cell is read and determined to be in, say, the 1 state, it does not need to be checked for the 2 and higher states; and if the cell is read for these higher states, they will be conducting, wasting current while providing no additional information. To avoid this, the memory device can use a "lock out read" where, once a cell's state is determined, that bit line is locked out from further reading for other, higher states until that page is finished and the memory moves on to a new page. Consequently, a lock out read uses less current, but at the cost greater complexity and lower performance so that "no lock out" (NLO) operations are also commonly used, depending on the application. (More information on no lock out reads and also sense amplifier circuitry applicable here can be found in US patent publication number 2014-0003157.) The consequences of the near block-far block variation is more pronounced in the no lock out case, as can be illustrated with respect to FIG. 14.

FIG. 14 looks at the most problematical bit line pattern for the no lock out case. With respect to the center g bit line, the second-most adjacent bit lines are highly conductive (as if the corresponding selected memory cells were in, for example, the 0 state and the sensing operation is for the 3 state, pulling, say, 200 nA) can couple down the immediate neighbor non-conducting bit lines, making their ramp up slower and resulting in a longer bit line settling time. The amount of coupling is dependent on the final level of the highly conducting bit lines. Due to bit line resistance, when a far side block is selected the bit line will see a significant IR drop and the highly conductive bit line level at the far side block will be much lower, thus coupling even more strongly, leading to longer bit line settling time.

Figure 15:
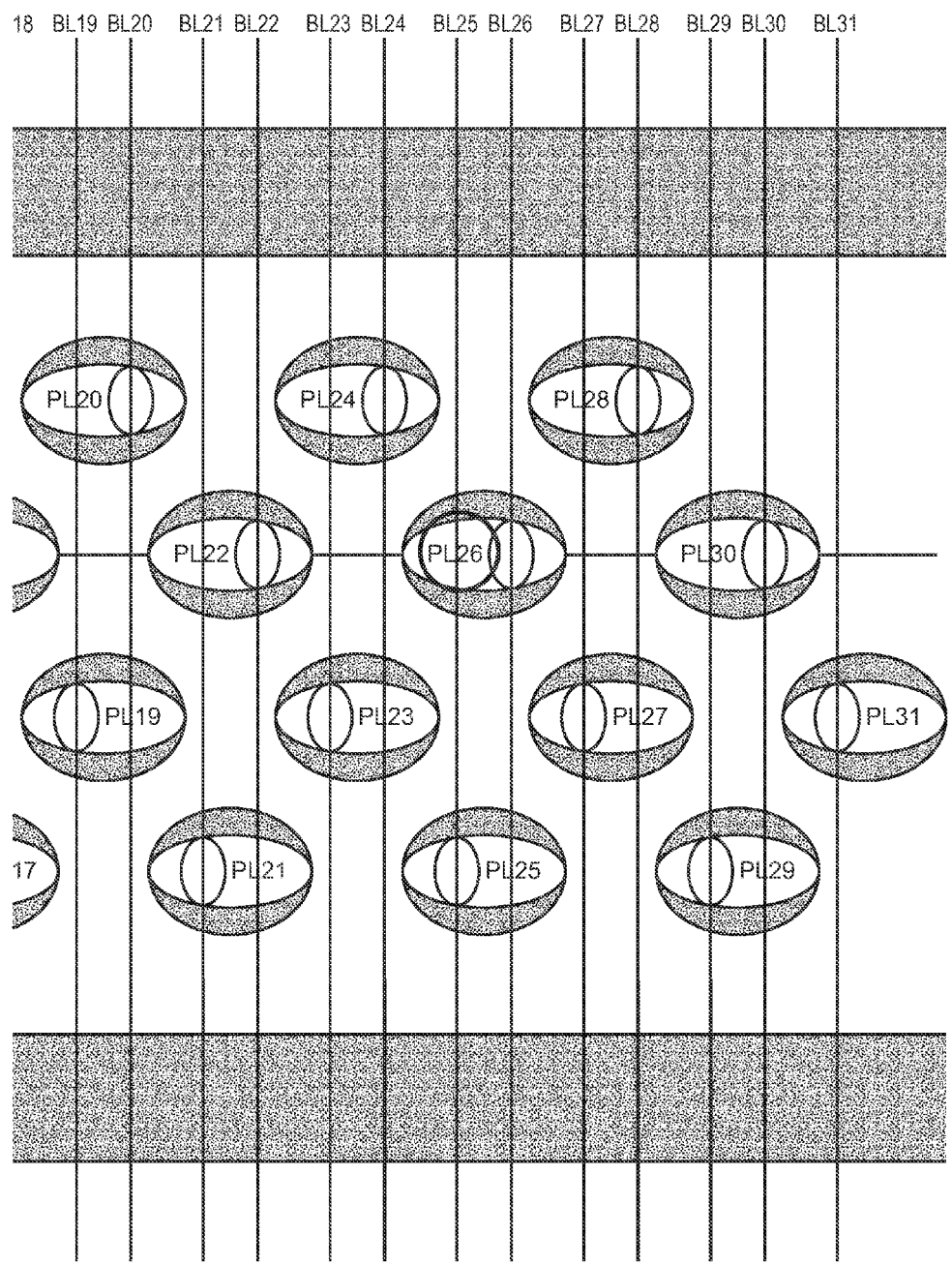
FIG. 15 is a more detailed view of a portion of a finger structure seen from above.

The following discussion is mainly given the context of a 3D NAND structure of the BiCS type since the situation is often more acute for this architecture, but the techniques described are applicable to other types of array architectures, including the 2D NAND. The reason why the problem is more acute for the BiCS types structure can be seen by comparing FIG. 6 with FIG. 15. In the 2D NAND block of FIG. 6, each bit line (aside from the end bit lines) has one neighbor on each side. FIG. 15 is a more detailed view of a portion of a finger structure seen from above, where the NAND strings run down into the page. Looking at NAND string PL26, this has a number of near neighbors with which it may couple and the off-setting of these columns places the global bit lines across the top in close proximity, aggravating the problem relative to the 2D structure. Whether for 2D or 3D, the continued in decreasing device scales and increasing of place size will continue to make this problem prominent.

Figure 16:
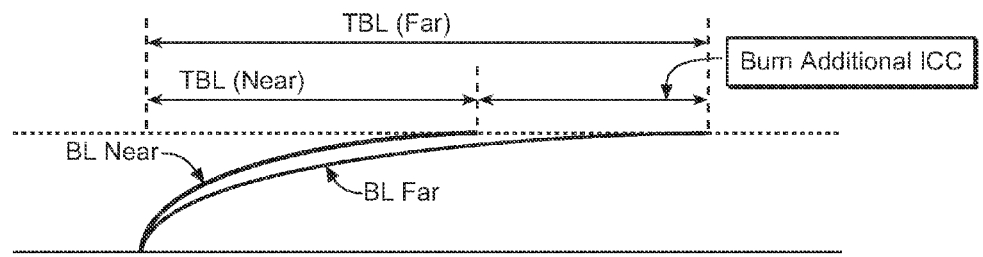
FIG. 16 illustrates the relative times for pre-charging a bit line for a near block, TBL(near), and a bit line for a far block, TBL(far).
Figure 17:
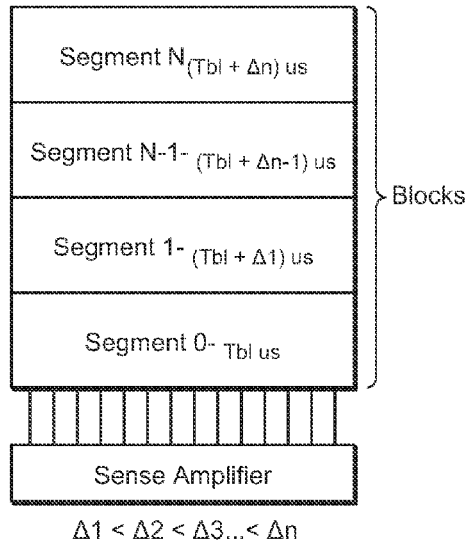
FIG. 17 illustrates the blocks of an array split up into a number of segments, each of one or more adjacent blocks.

FIG. 16 illustrates the effect, showing the relative times for pre-charging a bit line for a near block, TBL(near), and a bit line for a far block, TBL(far). The near block bit line has a shorting settling time, ramping up mover quickly than for the far side, consequently having faster performance. If the same timing is used for both the near and far blocks, the additional time allotted for the far blocks will burn current not needed to the settling process. To be able to improve performance and power consumption for the block nearer the sense amp circuits, these can use different timing. In the exemplary embodiment, the total number of blocks is divided into N number of segments, where the closer a segments is to the sense amps can, short the time allotted, improving performance and using less current. FIG. 17 represents this schematically.

As shown in FIG. 17, the blocks spanned by the bit lines are split up into a number of segments, each of one or more adjacent blocks. In the example, Segment 0 is nearest the sense amplifier circuits and each of the N additional segments, where N≥1, use a different timing depending on proximity to the sense amps. Being closest to the sense amps, the blocks in Segment 0 will have the best performance, use the least system current ICC, and can use the fasting timing, Tbl. Each of the other segments will have different timing offset $\Delta i$ for Segment i, the offsets being longer as the block segment is further away: $\Delta 1 < \Delta 2 < \Delta 3 \ldots < \Delta N$. (Equivalently, the base timing could be for the furthest or an intermediate Segment, the offsets being decreases or increases as appropriate.) The setting of the time can be based on a control signal (here represented as "cont") to the sense amp circuitry from the on-chip control logic, for example, based on the physical address to be accessed. For example, a sensing operation will typically have a number of sub-operations or phases to establish the needed bias conditions, such as setting levels on a bit line clamp, turning on select gates, and so on. The total read or verify time while the combined clocks from these phases. Although the other phases' clocks signals can be the same, the control signal here will set the time allotted for bit lines to settle after a bit line select gate is turned on to pre-charge the bit line form the sense amp.

In FIG. 17 the segments are represented as being of the same size, but the number of blocks can also vary from segment to segment if the timing variations along the bit lines is particularly non-linear, with, for example, segments having fewer blocks where timing variations change more quickly. Similarly, the difference in the $\Delta i$ may be a uniform step size (i.e., number of clock cycles) or not, depending upon device behavior.

The difference in segment timings can be based on using a different number of clock cycles. The values can be settable parameters determined by the behavior of the device or similar devices during device characterization tests. Depending on the embodiment, the initial values set prior the devices being supplied to users can be fixed or changed as the device ages. A wide range of values for the parameter can be available, from which values can be selected, where these values may change as a device ages, depending on the change of sheet resistance of the metal and also bit line lengths. The settling times involved can be for sensing (both data read and verify) operations, including pre-charge and other phases where a bit line level needs to be set, or other operations using the sense amps to set bit line levels.

Figure 18:
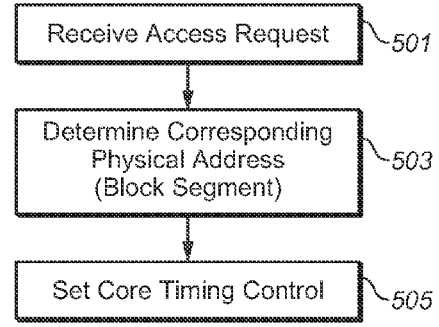
FIG. 18 is a simplified flow of some aspects of the process involved.

FIG. 18 is a simplified flow of some aspects of the process involved. The memory circuit receives an access request for a specified physical address at 501. At 503 the memory circuit then determines the block segment, or more generally just the block, to which the specified address corresponds. At 505, the core timing is then set for the corresponding operation based on the determined block segment to reflect the proximity to the sense amps. In this way, the memory system can provide high performance while reducing current consumption.

Single Ended Word Line/Bit Line Time Constant Measurement

The preceding section considered block segmentation for faster bit line settling and recovery. The following section considers word line settling times. In both cases, time constants related to the rate at which the bit lines or word lines charge or discharge are used. In memory circuits such as those described above, each of the word lines and bit lines are frequently driven from just a single end. This section looks at techniques for determining these sorts of time constants. In particular, it presents techniques for determining at the driving end the rate at which the far end of an access line (such as bit line or word line) charges or discharge in order to determining the time constants used.

Figure 19:
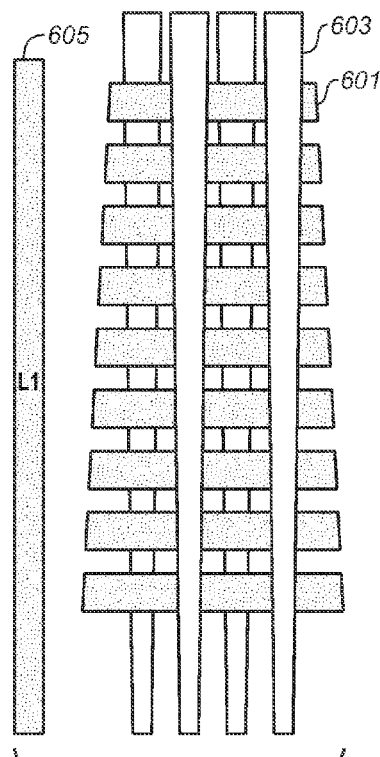
FIG. 19 is a detail of FIG. 11 to illustrate how the RC time constant associated with word lines may also vary based upon the word line's location within a block.

The preceding section discussed how the RC constant along a bit line can vary based upon a block's location. The RC time constant associated with word lines may also vary based upon the word line's location within a block. FIG. 19 illustrates the situation in a BiCS context. FIG. 19 is a detail of FIG. 11 and shows a portion of one finger and the adjacent local interconnect for the common source line. Here 9 horizontal word lines, such as 601, are shown along with 4 memory holes, such as 603, along which the NAND strings reside. To the left is a local interconnect LI 605 for the source line. Due to processing differences, the word lines are not uniform, varying from one another down the stack. As illustrated, the word lines tend to get wider, and the memory holes narrower, as they are deeper in the stack. For example, variations in the spacing from LI to the different word lines can arise from the etching process. This can result in the RC time constant for the top word line differing noticeably from that of the bottom word line, perhaps by a factor of two or more. This sort of variation in word line and bit line time constants makes it useful to measure them.

Figure 20:
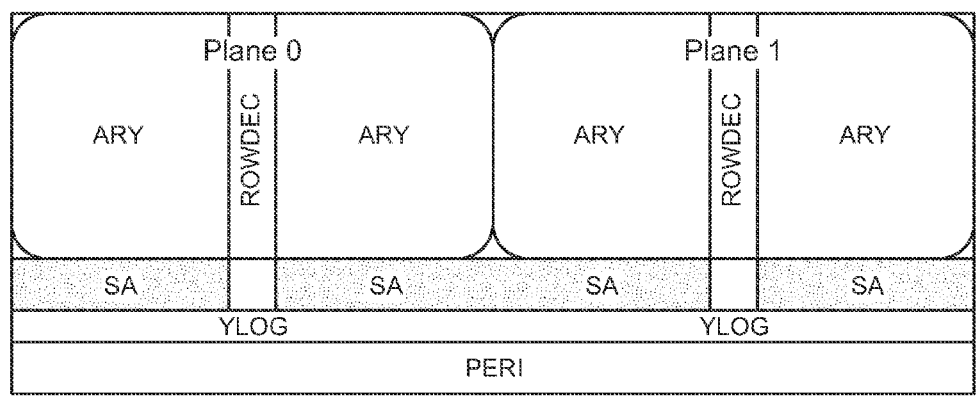
FIG. 20 represents a top view of a portion of an example of a memory chip.

The determination of the time constant at the far end of a control line when driving it at the near could be done by actually measuring at the far end; however, a typical memory structure generally lacks the needed connections and circuitry on the far end. FIG. 20 illustrates some of the constraints involved in RC time constant detection. FIG. 20 represents a top view of a portion of an example of a memory chip. In the shown arrangement, there are two planes (Plane 0, Plane 1), each with two memory arrays. Along the bottom of each array are the sense amplifier circuits SA, as in FIG. 13, and below these are the column related logic YLOG and other peripheral circuitry PERI for the memory's operation. The row decoders used in decoding and driving the word lines are formed between the pair of arrays of each plane, so that the circuitry is connected along only the one side of the word lines. Under this arrangement, there is only the structure to perform a time constant measurement using just one input/output source for word lines (from the row decoders) and bit lines (from the sense amp end).

When a bit line or word line is charged up from the supply, the current is supplied by an RC network. To the first order, the equation for the current i from the supply vsup can be expressed as $$i(vsup) = A\exp(-t/\tau).$$

If values can be obtained for i(vsup) for two time values, this can be solved for the constants A and $\tau$=RC. The output at voltage v(WL) at far side of the WL can be expressed as $$v(WL) = VSUP \times (1 - \exp(-t/\tau)).$$

Figure 21:
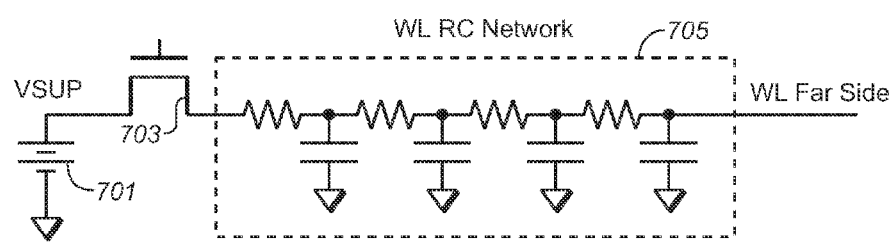
FIG. 21 schematically represents some of the elements involved for the single ended time constant measurement of a word line.

FIG. 21 schematically represents some of the elements involved for the single ended time constant measurement of a word line. A supply 701 is connected through decoding circuitry, here a switch 703, to the word line, whose intermediate portion is here represented as an RC network. To perform a time constant measurement, the word line can initially be grounded, after which VSUP is connected by flipping the switch 703. The number of clock pulses until the current i(VSUP) crosses certain points can be counted. These crossing points can then be used to extract the time and i(VSUP) relationship with a curve fit to the exponential equation to obtain time constant.

Figure 22:
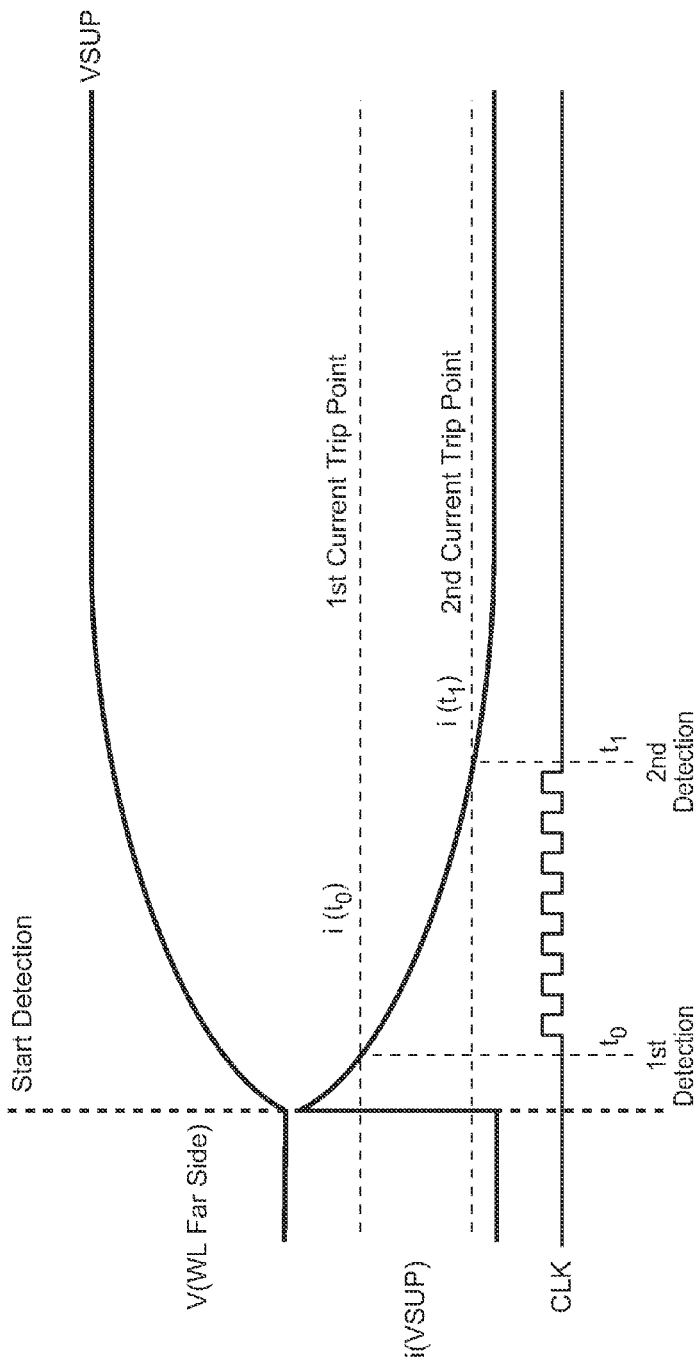
FIG. 22 is a circuit functionality timing diagram for detecting the charging up of the far end of a word line.

FIG. 22 is a circuit functionality timing diagram for detecting the charging up of the word line. At top is the voltage level at the far side, starting at ground and asymptotically approaching the supply level. In the middle is the current i(vsup) from the supply, initially high when the switch is closed and then dropping past first and second detection points. The first detection point is a first current trip point that start the clock CLK and the second detection point is the trip point to turn the clock off. The number of clock pulses times the clock period is then the time when i(vsup) equals to a predefined current trip point.

A fast RC measurement can be done by logic on the circuit. Returning to the equations, as $i(t) = A\exp(-t/RC)$, then $t = RC \times \ln(A/i(t))$, so that $$\Delta t = t_1 - t_0 = RC \times \left(\ln\left(\frac{A}{i(t_1)}\right) - \ln\left(\frac{A}{i(t_0)}\right)\right) = RC \times \ln\left(\frac{i(t_0)}{i(t_1)}\right)$$

The difference in time can be measured by the number of clocks n between $t_1$ and $t_0$, $\Delta t = n \times t_{clk}$, so that $RC = n \times \{t_{clk}/\ln(i(t_0)/i(t_1))\}$. The detection current can be set at convenient values for easier calculation. For example, setting $i(t_0)/i(t_1)$ to 2.718 (e) or 7.389 ($e^2$) respectively gives $\ln(i(t_0)/i(t_1)) = 1$ or 2. For example, $i(t_0)/i(t_1) = 2.718$ yields $RC = n \times t_{clk}$, simplifying calculations.

Figure 23:
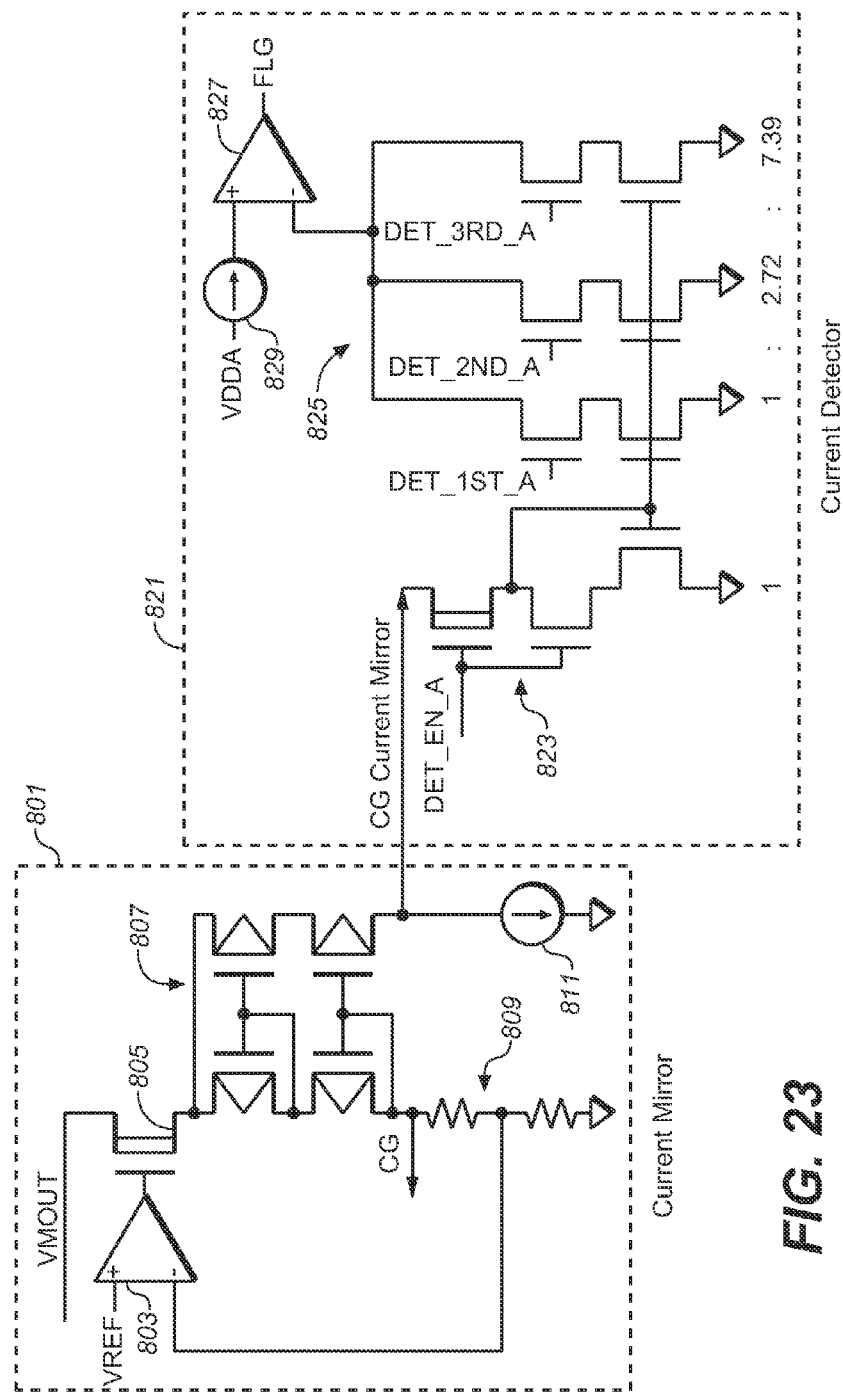
FIG. 23 is a block diagram of an exemplary RC measurement circuit.

FIG. 23 is a block diagram of an exemplary RC measurement circuit. The word line voltage CG is supplied by the current mirror 801 that mirror this level for a current detector circuit 821. The current mirror 801 provides the word line voltage CG through a transistor 805 above a node of a voltage divider 809, shown as a pair of resistors in this example. The gate of the supply transistor is controlled by op-amp 803 whose first input connected to a reference level VREF and whose second input is taken from the feedback network 809. The word line voltage is taken from the first leg of the mirroring transistors 807, whose second leg provides the mirrored current to the current detector 821 and includes the current sink 811 to cancel resistor current.

In the current detector section 821, the GC current mirror value is supplied to a first leg of current mirror there through the transistors 823 when enabled by the DET_EN_A signal. A mirroring section 825 has three legs that are selectively enabled based on corresponding signals DET_1ST_A, DET_2ND_A and DET_3RD_A that are sized in the ratios of 1, 2.72, and 7.39 in order to simplify the logics computation, as discussed above. The three legs of the mirroring section 825 are connected to one input of an op-amp 827 that has its other input connected to a fixed reference current 829 for comparator offset cancellation and has a flag value FLG as the output. The logic block has two main functions: to use FLG to determine which current mirror branch of 825 to enable; and enable the counter depending on the DET_1ST/2ND/3RD_A signals.

Figure 24:
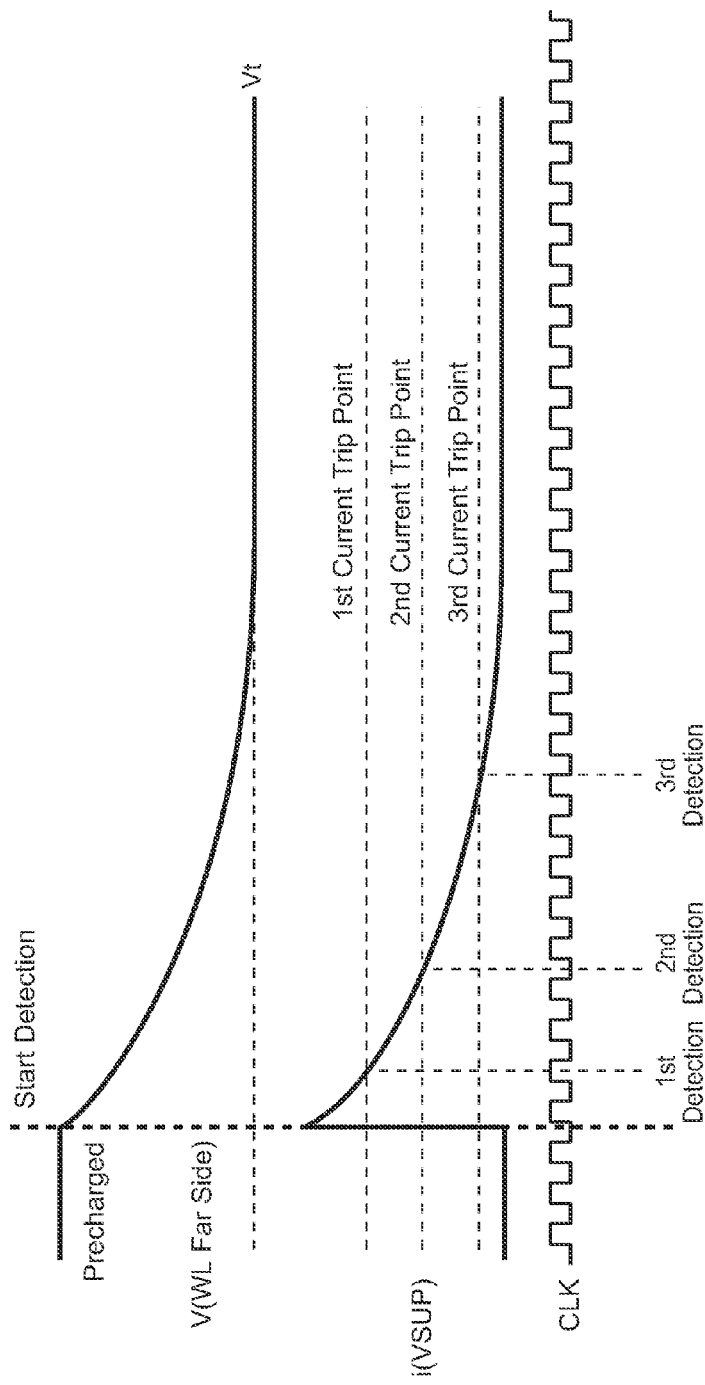
FIG. 24 illustrates an alternate embodiment using three detection points determines the time constant by discharging, rather than charging, the far end of the line.

The embodiment of FIG. 22 illustrated using two detection points, but more can be used for increased accuracy, as with the three values of FIG. 23. FIG. 24 illustrates an alternate embodiment using three detection points determines the time.constant by discharging, rather than charging, the far end of the line.

Figure 25:
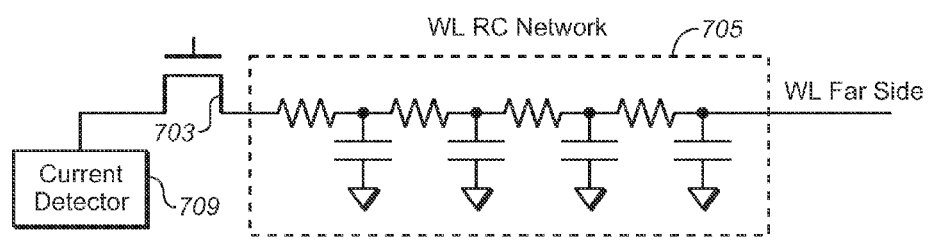
FIG. 25 is similar to FIG. 21, but with a current detector at the near end for the implementation of the embodiment of FIG. 24.

FIG. 24 is a timing diagram for discharging the word line's far end as represented schematically by FIG. 25, that is similar to FIG. 21 but with a current detector 709 at the near end. Initially the far side of the word lines is pre-charged. The detection process begins when the switch 703 is opened and the word line's far end begins to discharge, as shown in the top line. As shown in the second line, the current level goes high and asymptotically decreases, passing first, second, and third detection points. The clock signal s shown at bottom. The number of clock pulses time the clock period gives the time when i(VSUP) equals the predefined current trip point.

Performance Optimization for Word Line Settling

Figure 26:
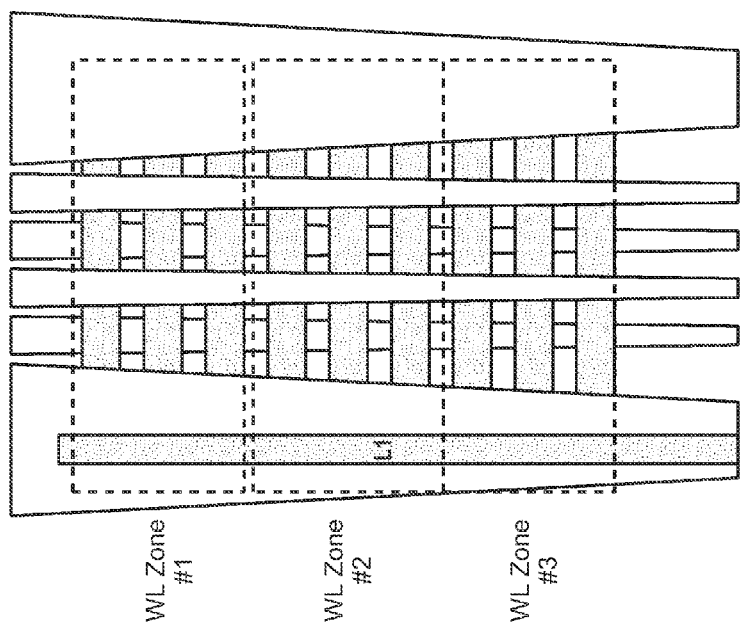
FIG. 26 illustrates the splitting of word lines into multiple zones.

This section looks at optimizing the performance of the memory by varying timing based on the time constant for the word line's settling, either on a word line by word line basis or by grouping word lines with similar RC values into zones. FIG. 26 illustrates the splitting of word lines into multiple zones, where the example shows three zones for the shown word lines. The techniques of the previous section can be used to measure the worst word line RC constant within each of the zones and the result can be written into the corresponding parameter values. The memory can then adjust a selected word line's ramp time according to its zone to gain performance on average. In one embodiment, the parameter measurement can be done through the controller, with the loading of the parameter based on a selected word line is then done independently of the controller.

Figure 27A:
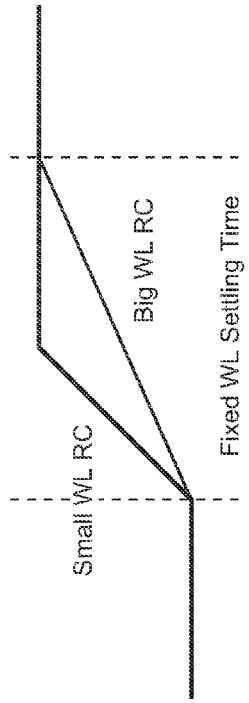
FIG. 27A is a schematic representation of the relative rates are which differing word lines charge up.
Figure 27B:
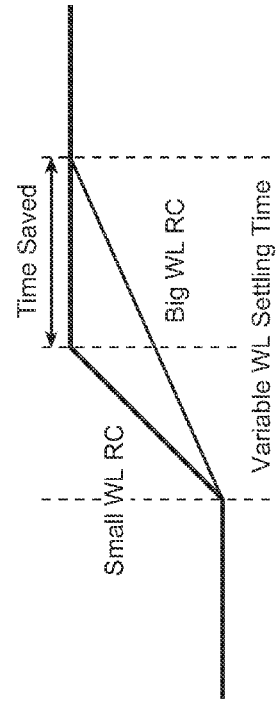
FIG. 27B is a schematic representation of the time savings available by using differing timings for word lines with a faster RC constant.

FIG. 27A looks at the case without word line RC feedback so that all words lines use the same timing. When the word lines begin to ramp up, word lines with a small RC constant will ramp up more quickly than word lines with a big RC constant. If all word lines use the same fixed word line settling time, the settling/ramp time for sensing, programming and other operations requiring a settled word line value will be limited by the worst case word line RC time constant. If instead a variable word line settling time is used, operations can start earlier on word lines with smaller time constants. FIG. 27B schematically illustrates the time savings.

Figure 28:
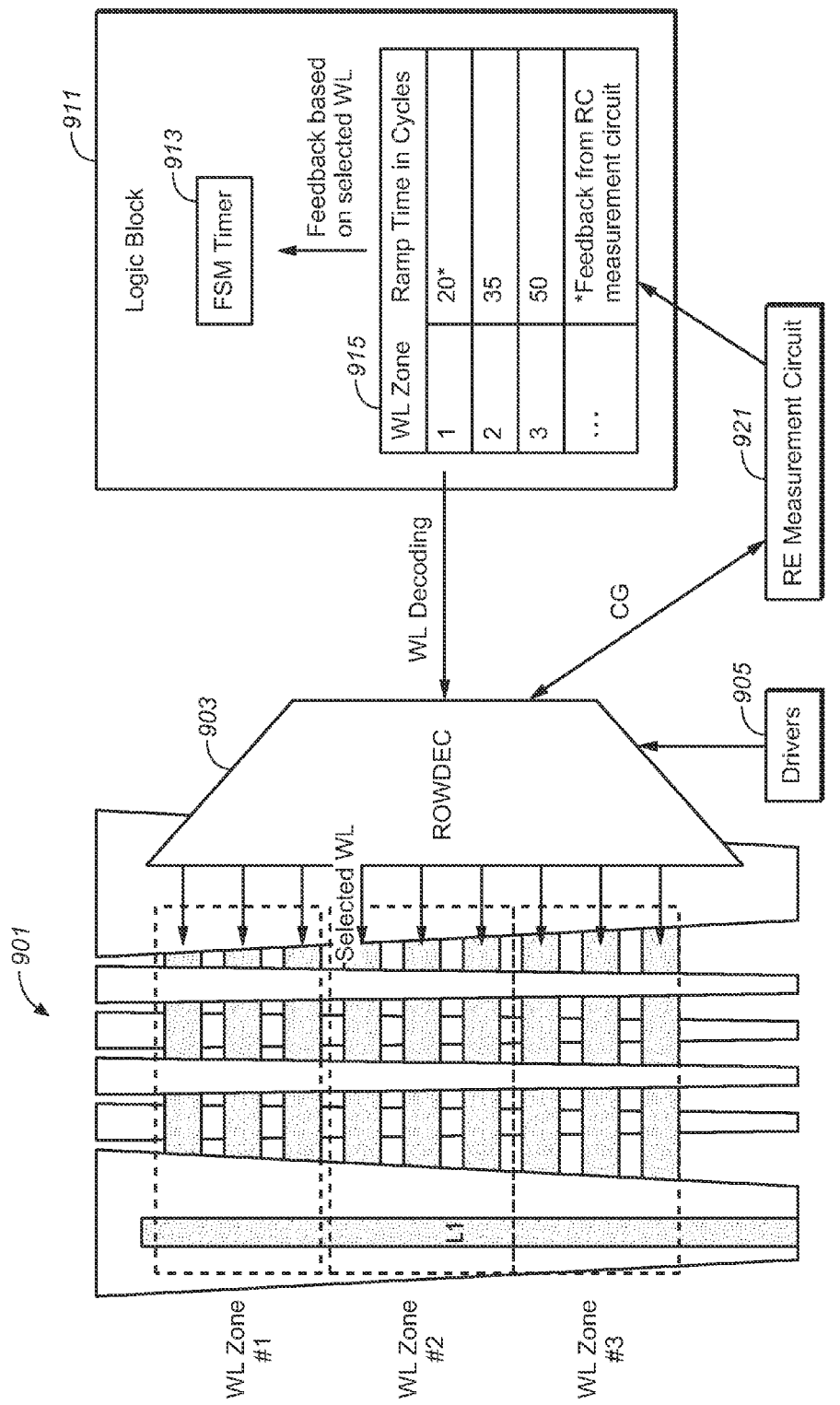
FIG. 28 is a block diagram of some of the circuit elements used for performance optimization based on the different settling times.

FIG. 28 is a block diagram of some of the circuit elements used for performance optimization based on the different settling times. A portion of a single finger is shown at 901, with the word lines split into three zones. A row decoder is represented at ROWDEC 903 that receives the various bias voltages from the drivers at 905. The figure shows the selected word line as being in word line zone #2. NAND memory operations often require that non-selected word lines also be biased to some level to which they will also need to ramp up, and that this non-selected word lines will have a different RC constant. These non-selected word line's ramp times sill often not be limiting as the levels on these lines will have previously be established. The logic block 911 provides the word line decoding signals and includes a finite state machine 913 and can use a look up table, for example, to provide values for the ramp times for different zones, such as illustrated schematically at 915 with some numbers listed for demonstration purposes. An RC Measurement Circuit 921, such as that in FIG. 23, can determine the values for the table 915. This arrangement improves performance as all but the slowest zone can use faster ramp times than the worst case.

The forgoing has presented a set of techniques and circuitry for a singled ended determination of time constants, where the exemplary circuit used a clock counter and current comparator with relatively minor penalty in area. These time constants can then be used to improve performance on average by using them to have differing ramp for different word lines or bit lines based on their locations within the array. The determined constants can also be used to provide finer word line ramp rate control so that word line ramp time is more consistent regardless of load. The time constants can be measured on-die, without need for hooking up the die to a measurement device, and can be quickly calculated.

Word Line Kick During Sensing

As discussed above, for word lines that are driven from a single end, when applying a voltage level to the driven (near) end, the far end of the word line can be relatively slow to charge up, slowing performance. One way to deal with this problem is to apply a "kick" to the word line, where, when a voltage level is applied, it is initial overshoots by some amount and duration, before being driven at the desired level. However, if this kick is too large in amplitude, duration, or both, this can also lead to longer settling times, while if too small it will not have the desired level of effect on the far end. As also discussed above, word line RC values often vary considerably across the array and over process corners, particularly in 3D or BiCS type structures. Consequently, finding a single optimum kick size that works in all corners is difficult, particularly with higher kick voltages due to fast overshoot. The following section applies the word line RC detection circuit described above to this problem, allowing for the trimming of the word line kick on a per-die basis.

The following also looks at the use of a neighbor reverse kick concept. When applying the kick on the selected word line, neighbor word lines will couple up due to word line to word line capacitive coupling. These neighbor word lines get driven down again by the drivers, but the discharge couples back into the selected word line, lengthening the settling time of the selected word line. By applying a small reverse kick to the neighbor word line, it reduces the coupling during the kick and discharge time, decreasing total settling time of selected and neighbor word lines.

Selected Word Line Kick Trimming

In a read operation, the read-pass voltage (VREAD) is applied to the non-selected word lines and a read voltage (VCGRV) corresponding to a given data state is then applied to the selected word line, where read voltage may initially be at the read voltage for another state or in an idle state. To accurately performing the sensing operation, rather a read or verify, the word lines need to settle. The settling times can show significant settling time variation over corners and, without trimming, settling times can be relatively long. Layer compensation, where a different kick voltage is used for different word line layers (see FIG. 26), can be used to compensate for variations in memory hole size in an array. With RC trimming and layer compensation, settling time can be improved significantly.

Figure 29:
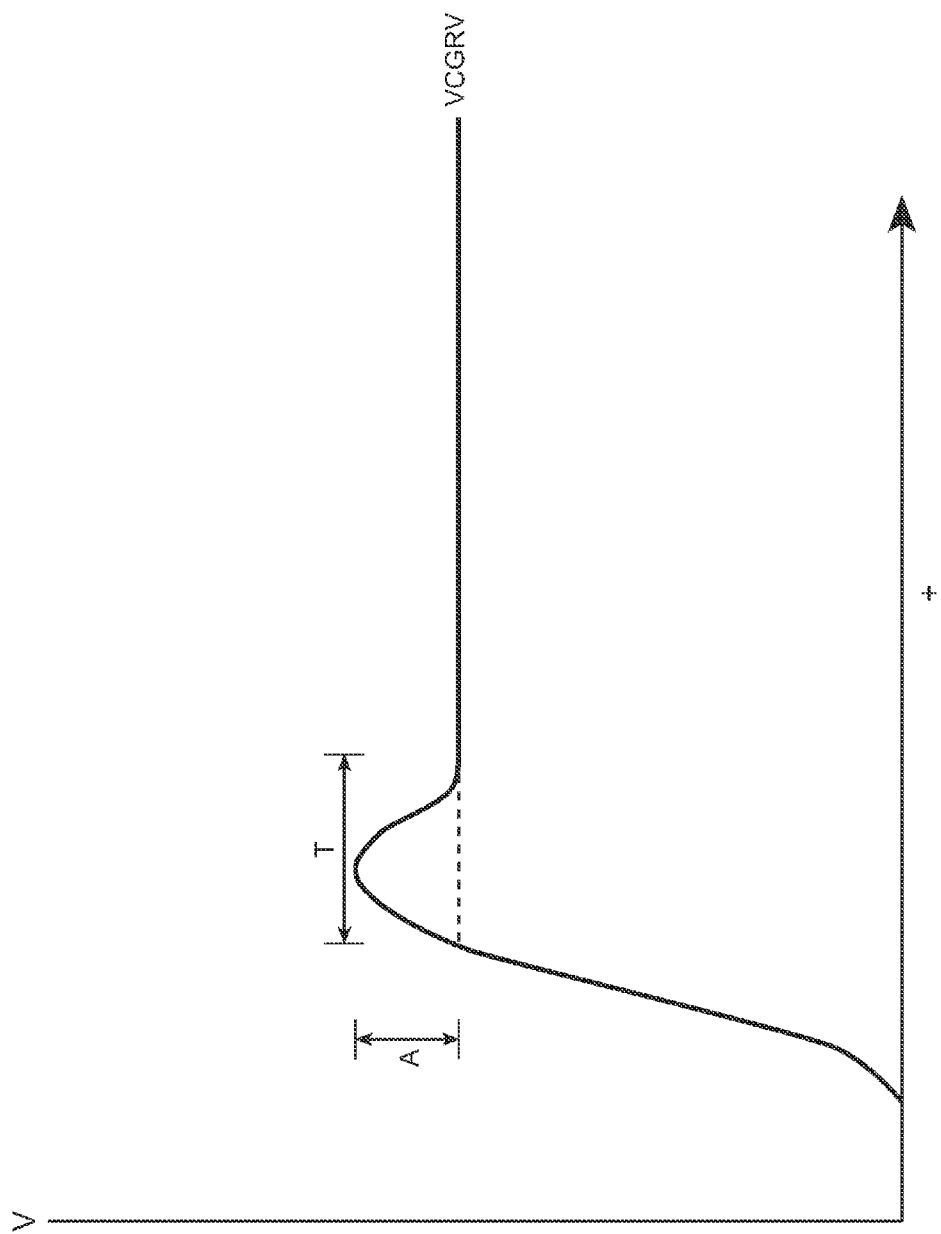
FIG. 29 illustrates the idea of a word line voltage kick.

FIG. 29 illustrates the idea of the kick. A word line's voltage is initially driven at a level Vin and then raised to the desired level VCGRV. The Vin level can be for an idle state or corresponded to another, lower data state, as when the memory shifts from reading or verify one state in a multi-state embodiment to a higher data state. The exemplary kick has an amplitude A and duration T, where in BiCS arrangement the amplitude A will typically be larger for upper word line zones. The trimming can done individual on each die to set the duration, amplitude, or both for the kick, which can also vary for levels. For example, the duration of the kick can be trimmed for the die, and then the amplitude can vary with word line zones.

As far as implementing the RC trimming, the RC detection can be implemented by an analog circuit as described above, which can provide, say, an 8-bit value representing the WL RC time constant in terms of a clock pulse count. This RC value can be used to define kick length, trimming the kick value to ensure optimum performance. The RC value can be used as-is or, for smaller transitions, just a portion (such as being divided in half) can be used for smaller steps (to increase kick voltage to be within parameter range). In addition to an initial trimming of a fresh device, the trimming can be re-run at any time to re-optimize kick times as the device ages.

Figure 30:
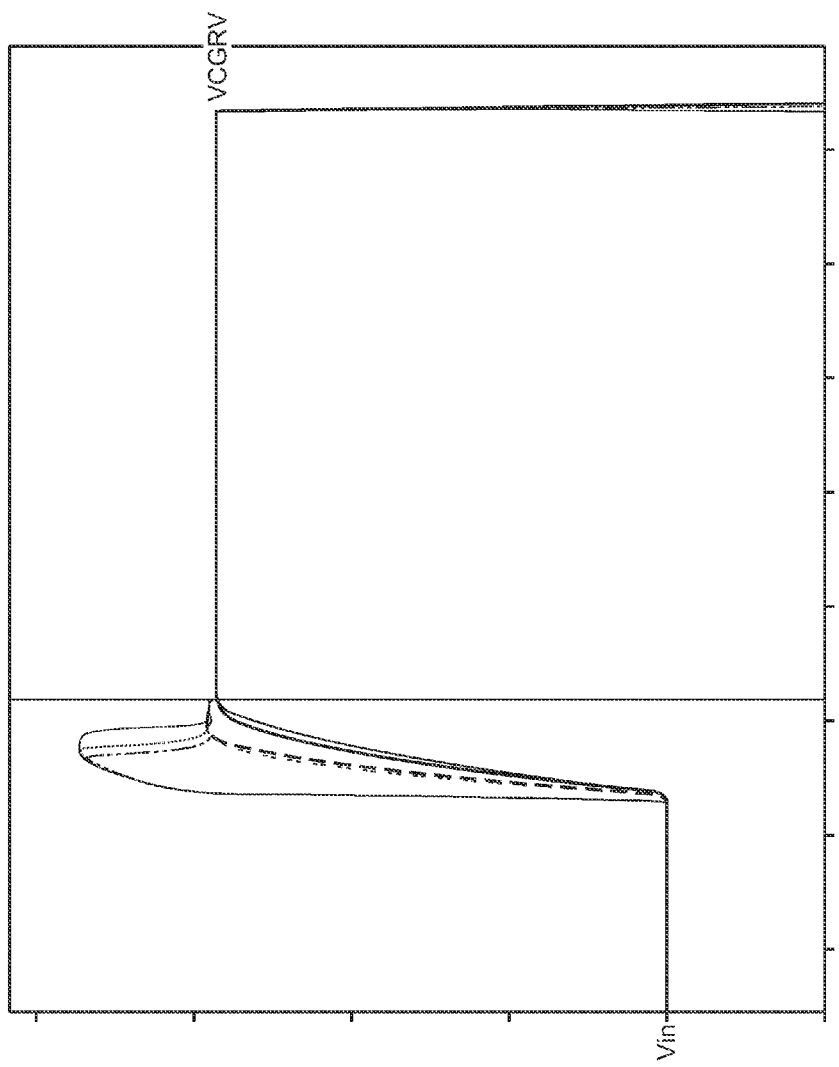
FIG. 30 shows examples of a word line settling during a transition to a read level with a kick trimmed for several process corners.

The traces of FIG. 30 show examples of a word line settling during a transition to a read level with a kick trimmed for several process corners. In each case the lines are the different combinations of worst and typical resistance and capacitance process corners. As shown, die from different corners are trimmed differently. Depending on the corner, transition size, and word line, a well-trimmed kick can reduce the settling time by over half.

Although discussed here in the context of selected word lines in a NAND type non-volatile memory, the RC detection and trimming techniques are more generally applicable to any long wire that is driven from one end and can be biased to higher that its setting target. This can include other control lines on a NAND memory array, as well as other types of circuits, such as word lines in a NOR type memory. Another example, in this case for volatile memory, is of pre-charging bit lines in a DRAM memory, which are in some cases pre-charged (such as to half of the VDD voltage).

Neighbor Reverse Kick

In a NAND sensing operation, the non-selected word lines are biased at VREAD and then the selected word line is set to the read value. When the selected word line is raised to the read level, this will also pull up the adjacent word lines due to capacitive coupling, increasing settling times on these non-selected word lines; and when the non-selected word line then drops back down, this will pull down the selected word line. This section looks at applying a reverse kick to the adjacent non-selected word lines to improve settling times.

Figure 31:
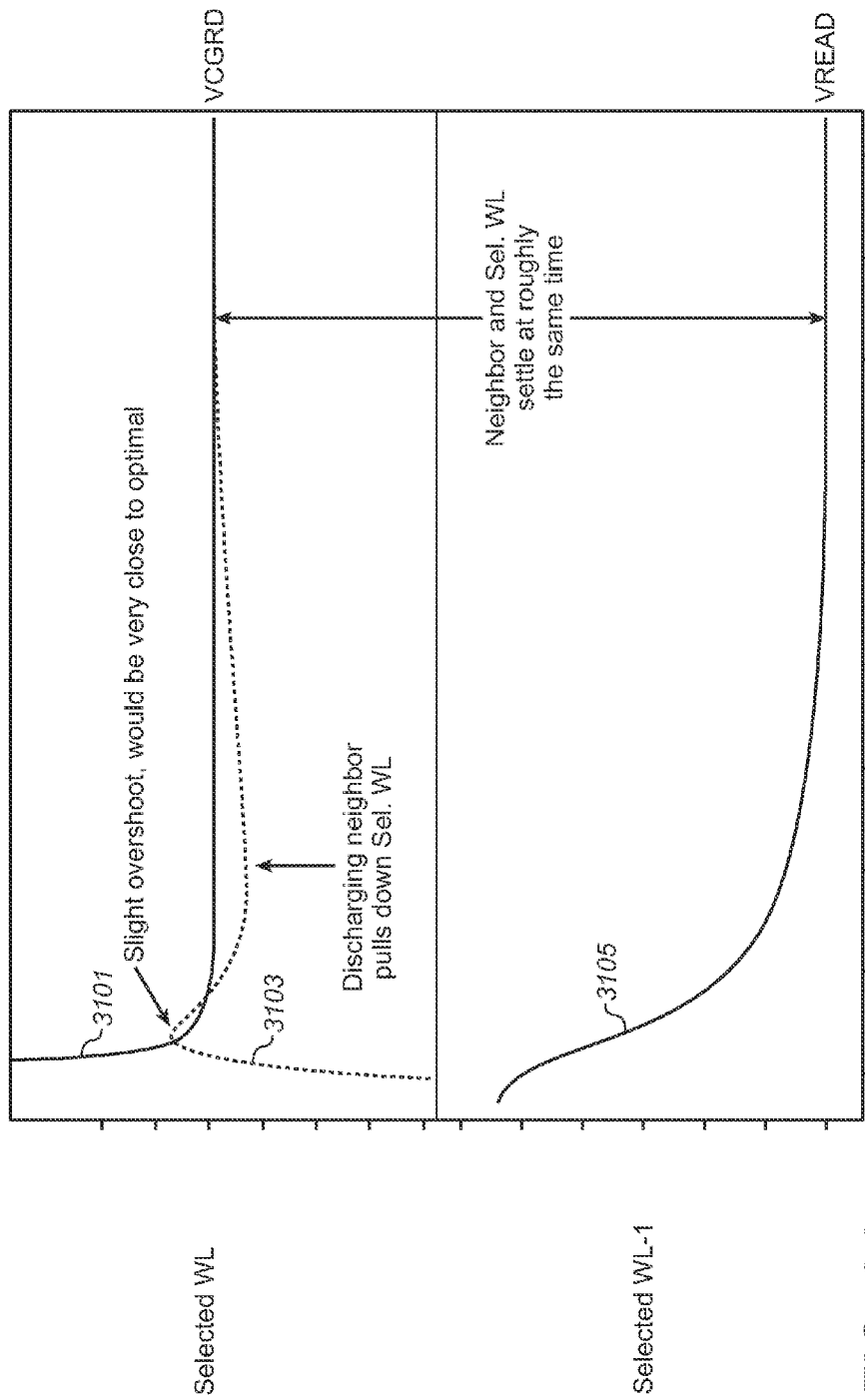
FIG. 31 detail of the voltage levels for a selected word line and neighboring word line.

FIG. 31 illustrates the situation. The top of FIG. 31 is a detail of selected word line, where 3101 is the near end and corresponds to a detail of one of the wave forms in FIG. 30 when the near (driven) end is just coming down from the kick, corresponding to the area a little to either side of the vertical line in FIG. 30. The trace 3103 shows the far end of the selected word line, that, due to the kick, is pulled up close to the desired VCGRV value. As shown in the lower part of FIG. 31 at 3105, the neighboring word line (Selected WL-1) has been pulled up above VREAD and needs to settle back down to VREAD. When the neighboring word line drops back down, this also pulls the far end of the selected word line as shown in 3103, with both the selected and neighboring word lines settling about the same time.

Figure 32:
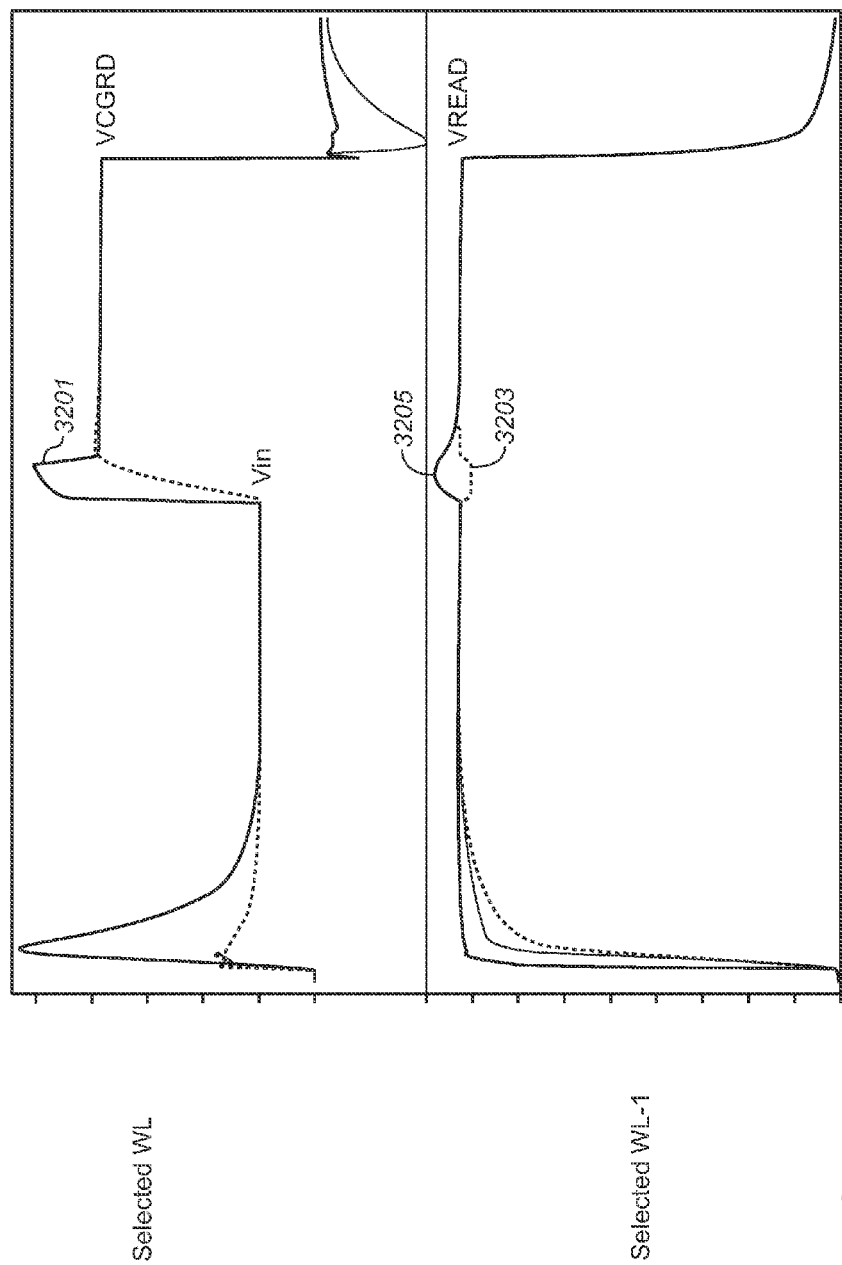
FIG. 32 again shows a selected word line at top and a neighbor at bottom.
Figure 33:
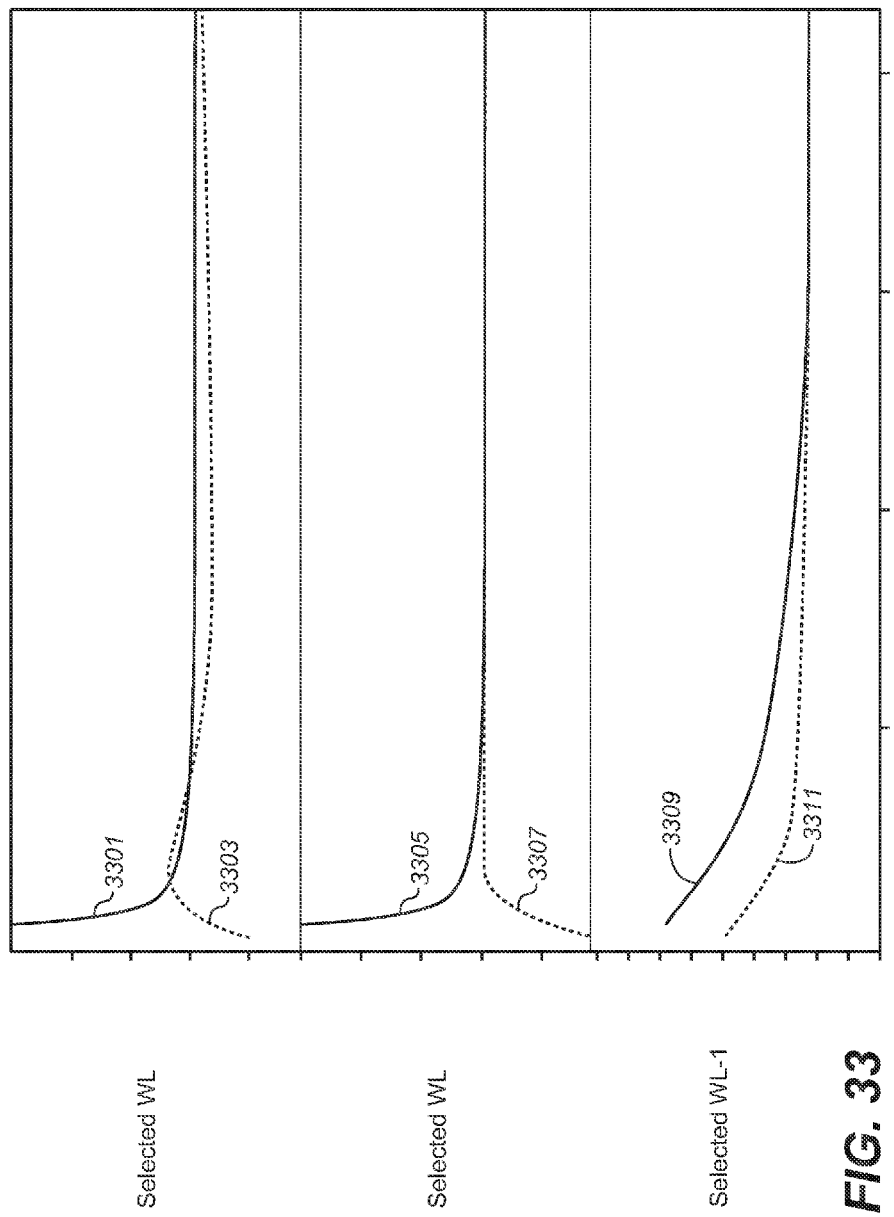
FIG. 33 shows the settling region for a selected word line without the neighboring word line reverse kick, with the neighboring word line reverse kick, and the non-selected neighboring word line.

FIG. 32 again shows a selected word line at top and a neighbor at bottom. For the selected word line, this is initially taken from ground up to a first level, then up to level under discuss here. Several different corners are shown, with the trimmed kick at 3201. 3203 is a near side neighbor word line when a reverse kick is applied and 3205 is the far side neighbor without a kick. FIG. 33 is a detail for some of the transition.

The top part of FIG. 33 shows the settling region for a selected word line without the neighboring word line reverse kick: 3303 is the selected word line's far side without its kick, and 3301 is the selected word line's near side. The middle part of FIG. 33 shows the selected word line with the neighboring word line reverse kick, where 3307 the far side and 3305 is the near side. The bottom part of FIG. 33 shows the non-selected neighboring word line without its reverse kick at 3309 and with its reverse kick 3311. As shown, the combination of well-trimmed kick on the selected word line in combination with a reverse kick on the neighboring word line (3305, 3311) lead to a shorted settling time for both. The reverse kick reduces settling time for selected word lines due to faster neighbor settling reducing coupling to the selected word line.

Consequently, the use of the trimming circuit to determine a well-trimmed kick can improve settling times on selected word lines, as well as on long wires driven from one end more generally. In a NAND type architecture, where the level on neighboring word lines is important for sensing, the use of a relatively smaller reverse kick on neighboring word lines can further decrease settling times. The reverse kick can be applied to neighbors on both sides of a selected word line, where these can also be used on any neighboring dummy word lines when these are used.

Voltage Kick to Non-Selected Word Line During Programming

This section again looks at applying a voltage kick to word lines, but now in the context of a programming operation. To provide context, the discussion begins with a discussion of programming operations on non-volatile memories, particularly in the NAND type of structures.

Figure 34:
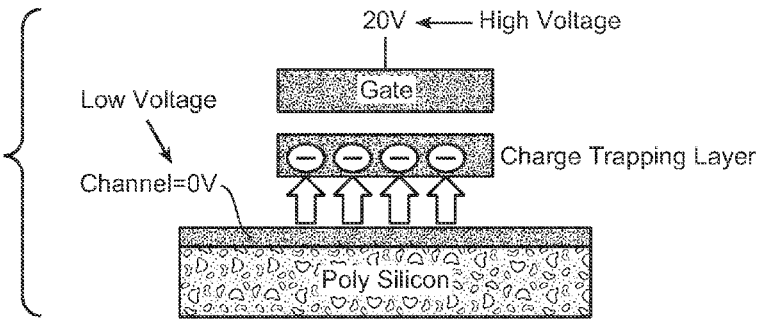
FIG. 34 is a schematic representation of the programming of a memory cell.

In a non-volatile memory, the goal of program is to insert electrons into the charge-trapping layer, whether of the floating gate or dielectric variety. By raising the word line to a high voltage, and applying a low voltage to the channel, an electric field is created. The electrons are pushed into the charge trapping layer from the polysilicon. FIG. 34 represents this schematically, where a high voltage (20V, for example) is applied at the cell's gate and the channel is at a low voltage (0V, for example).

In a NAND type architecture, the individual cells are formed along NAND strings, where the strings need to biased to facilitate programming for selected cells on selected word lines on selected NAND strings, and inhibited for cells non-selected word lines and for cells on the selected word line, but on a non-selected string.

Figure 35B:
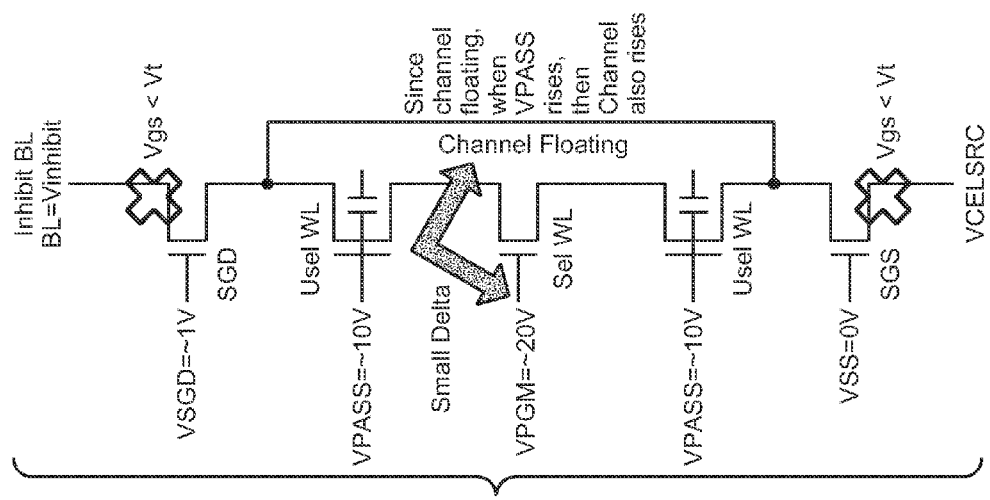
FIGS. 35A and 35B respectively illustrate a program inhibited and a program enabled NAND string of a selected block.
Figure 35A:
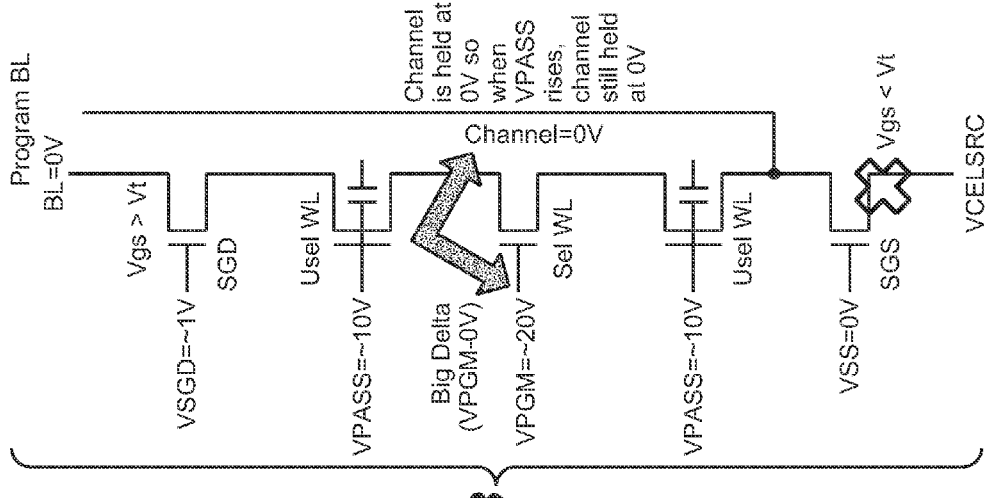

FIGS. 35A and 35B look at the biasing of NAND strings that share a common set of word lines, including the word lines selected for programming, when programming is to be inhibited (FIG. 35A) and is to be enabled (FIG. 35B). The selected word line receives the high program voltage VPGM=~20V and the non-selected word lines a pass voltage of VPASS=~10V, the select gate on the drain side is set at VSGC=~1V, the source side select gate is set to ground, and the source line voltage VCELSRC is set at some voltage to cut off the source select transistor, such 2-3V. To enable programming, the bit line is set low, such as 0V, while for inhibiting programming the bit line set to cut off the drain select gate by use of a program inhibit voltage Vinhibit of, say, 2-3V. Both here and below, it should be noted that these are just example values to demonstrate the concepts, but that other values can be used. In some embodiments, not all of the non-selected word lines will use the same VPASS level: for example, to provide more channel boosting neighboring non-selected word lines may use a somewhat higher VPASS level, more distant non-selected word lines may use a lower level, or some combination of these can be used.

As shown in FIG. 35A, when the bit line is at Vinhibit the drain side select gate is cut off, leaving the channel to float. Since the channel is floating, when VPASS rises, the channel will rise, inhibiting programming on the selected word line due to a smaller voltage difference. As shown in FIG. 35B, when the bit line is at 0V the drain side select gate is on, setting the channel to ground. Since the channel is held at 0V, when VPASS rises, the channel is still at 0V, promoting programming on the selected word line due to the large voltage difference.

As for the VPASS voltage, this should be high enough to allow a channel to conduct. VPASS is typically higher than VREAD, the voltage which is used during a READ operation. During a read operation the unselected word lines are at VREAD level and the selected WL is at VCGRV, where VREAD needs to be high enough to allow the channel to conduct. VPASS is at least the VREAD level to have a channel, so that when multiple word lines share the same channel and these word lines rise, they will help to boost up the same channel. Having the higher VPASS helps boost the channel up further so as to not program the cell if that cell is marked for inhibit. For inhibit cells, the channel is floating; and due to word line-channel capacitive coupling, when the unselected word lines rises to VPASS, that will help boost up the channel higher. Then the delta difference between the selected word line and the channel will be smaller when the selected word line is at VPGM.

As the nearer non-selected word lines have the largest effect on channel boosting, in some embodiments the word lines neighboring the selected word line use a higher pass voltage. As word line farther word lines have less of an effect, these may be taken to a somewhat lower pass voltage. When the array makes use of dummy word lines, these may use a lower pass voltage, both as these are on the ends of the array, and thus typically further from a selected word line, and also as these are not storing user data and are typically programmed to a relatively low state, so that they will conduct at a lower voltage.

As discussed in the preceding sections, word lines, particularly in the 3D/BiCS example, can have a large RC constant, so that when driven from one side, the far side rise time can be relatively very slow. FIG. 36A again illustrates the concept. Here the selected word line is driven on the near side by a driver CG through a block select gate BLKSEL that is controlled by the decoding circuitry. The word line is modelled as a resistance R and capacitance C, which is divided into a half at either end. FIG. 36B shows that effect of the large RC constant on the far side of the word line when applying the high programming voltage on the near side, with the last few percent of VPGM takes a long time to approach the near side value.

One approach to more rapidly raising the far side word line voltage would be a kick, similar to that described above for sensing operations; however, in the programming context this can have several drawbacks. One is program disturb, since if the near side kicks up too high, the memory can over-program the cell. Another is that the program voltages are typically quite high, particularly for the later pulses in the staircase, and generated by charge pumps, so that they are already at or near the maximum voltage levels on the device, so that the drivers cannot do any kick on selected word lines as they are at their maximum already. If the kick is instead applied on neighboring word lines, there will also likely be significant program disturb as these word lines are also already at a fairly high voltage. Consequently, it would be useful to be able to find a way to provide a kick, but without causing program disturb.

Figure 37:
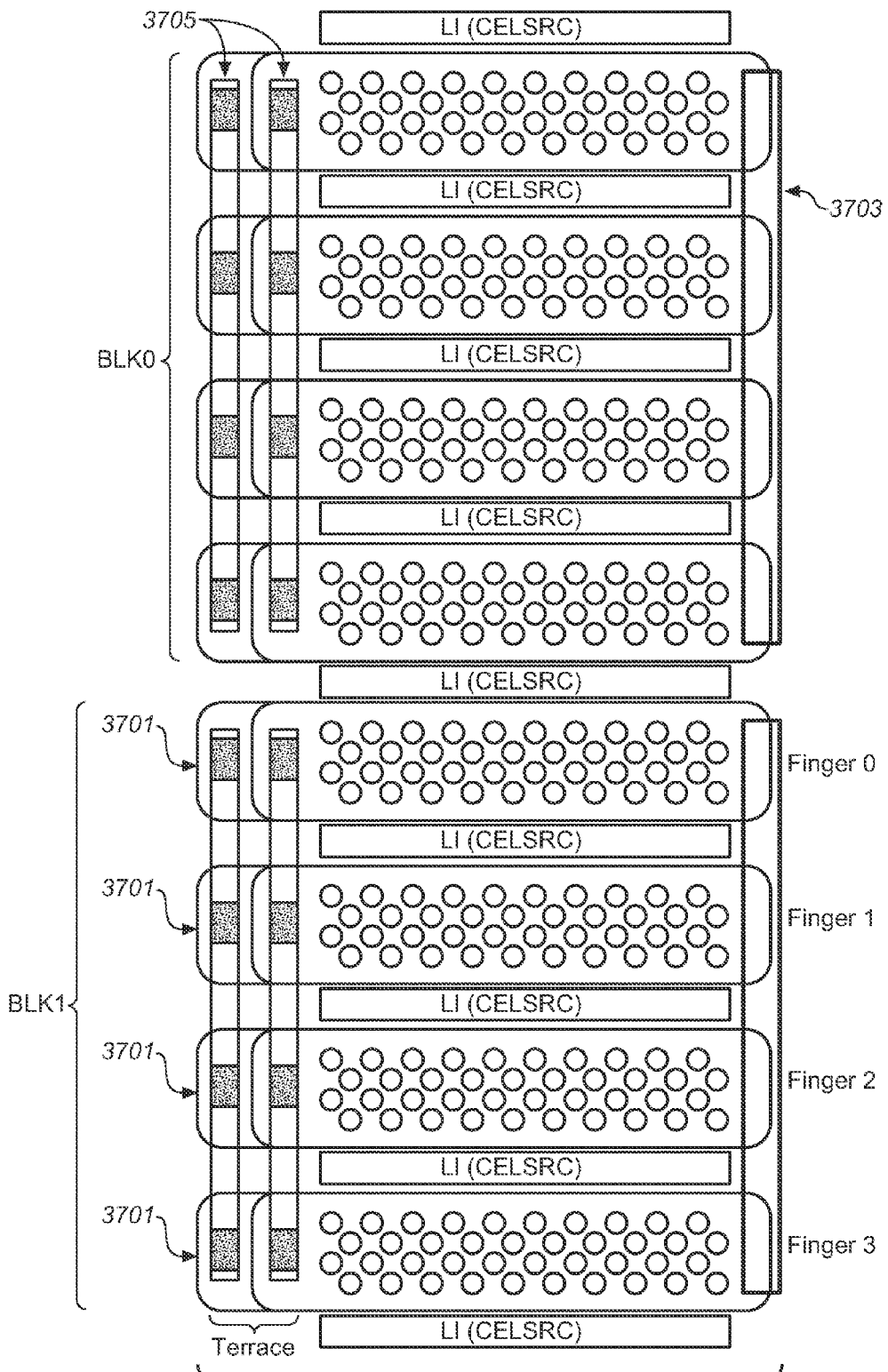
FIG. 37 shows some detail on how the word lines of a block are connected in a BiCS type structure.

FIG. 37 is a top view of two blocks of a BiCS structure and is similar to FIG. 10, but with some additional detail on the word line connections. Each of block 1 (BLK1) and block 0 (BLK0) have four fingers. The different word line layers extend out in a step-wise manner in the terrace region to allow connection to the drivers. Here two word line layers are shown, with the lower one only extending out at the terrace regions, as shown at 3701 for its four fingers. The word lines of the different fingers of a block at the same word line level are then commonly connected at the driving end as indicated for BLK0 at 3705. The different fingers also have their word lines of the same layer shorted together at the far end, as illustrated at 3703. Although the discussion here is given in the BiCS context, it also applies to other NAND architectures that break blocks into individually selectable sub-blocks (such as the fingers) that have word lines driven from one end and are shorted together at the far end or some intermediate location.

Figure 38:
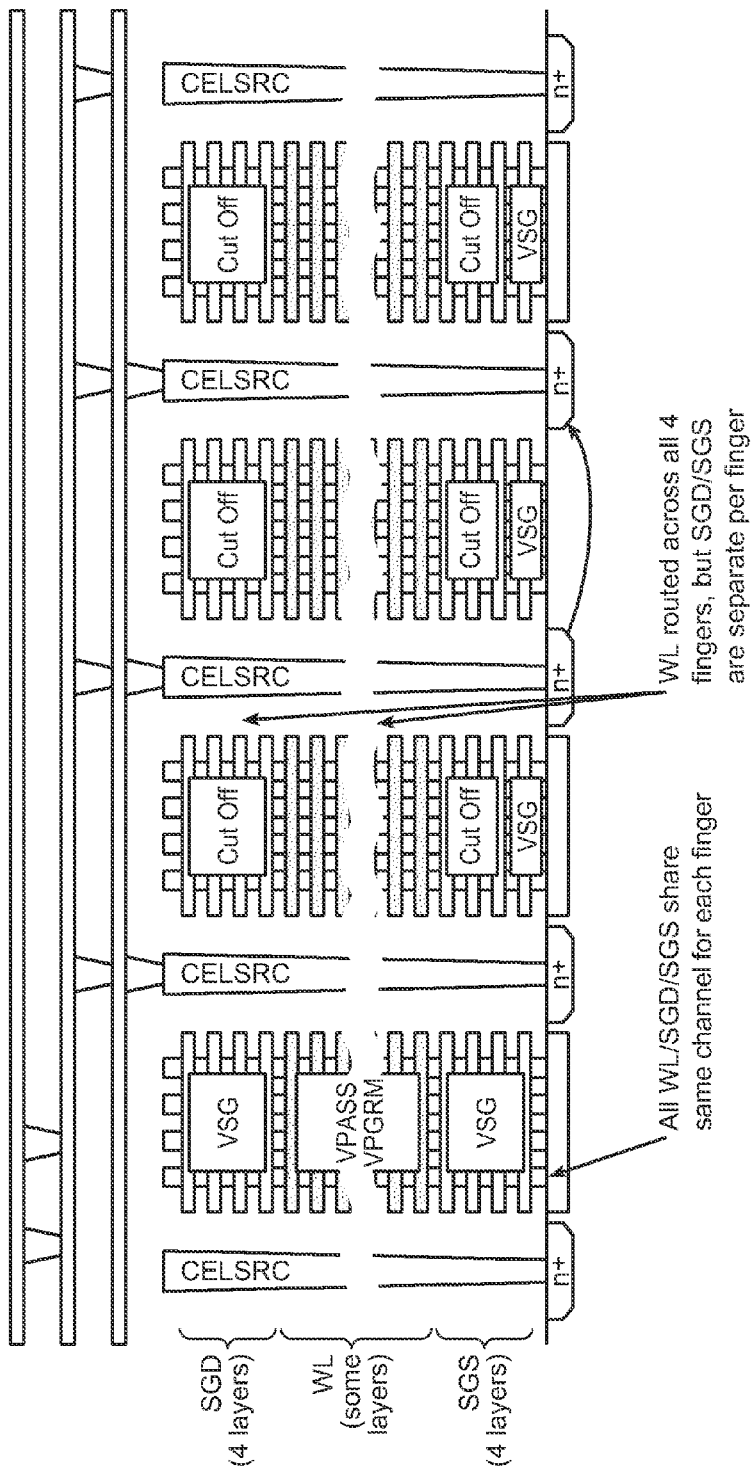
FIG. 38 is a side view of a block in BiCS structure illustrating the biasing during programming.

FIG. 38 gives a side view of a block to illustrate the biasing of the fingers during a write operation. The selected finger is on the far-left and is biased as discussed above with respect to FIGS. 35A and 35B. The other fingers share the word line levels, but have select gates that can biased separately. This allows for the drain side select gates to off independently of the bit line level, effectively inhibiting programming and allowing the NAND strings of these fingers to have floating channels.

Figure 36A:
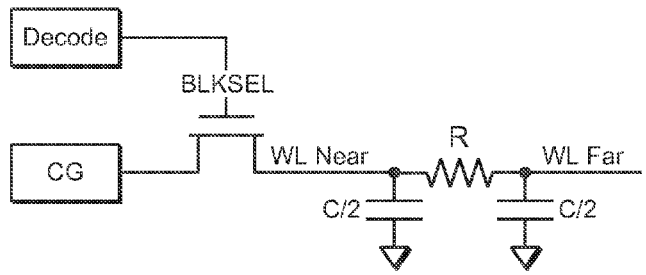
FIGS. 36A and 36B are a schematic representation of driving a word line from one end and the rise time on the non-driven far end, respectively.
Figure 36B:
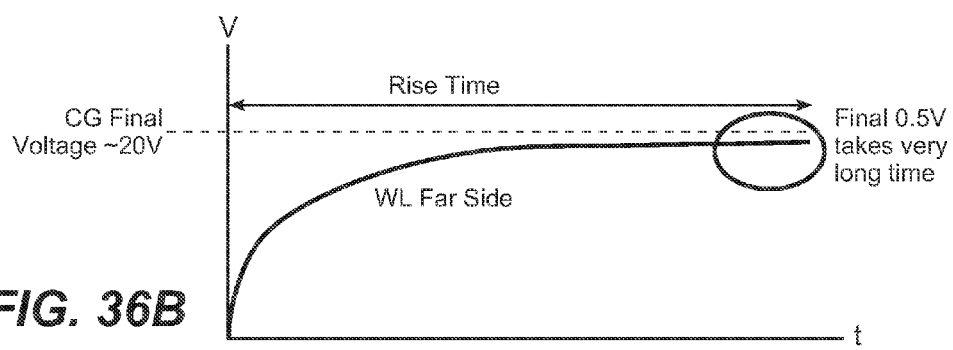
Figure 39:
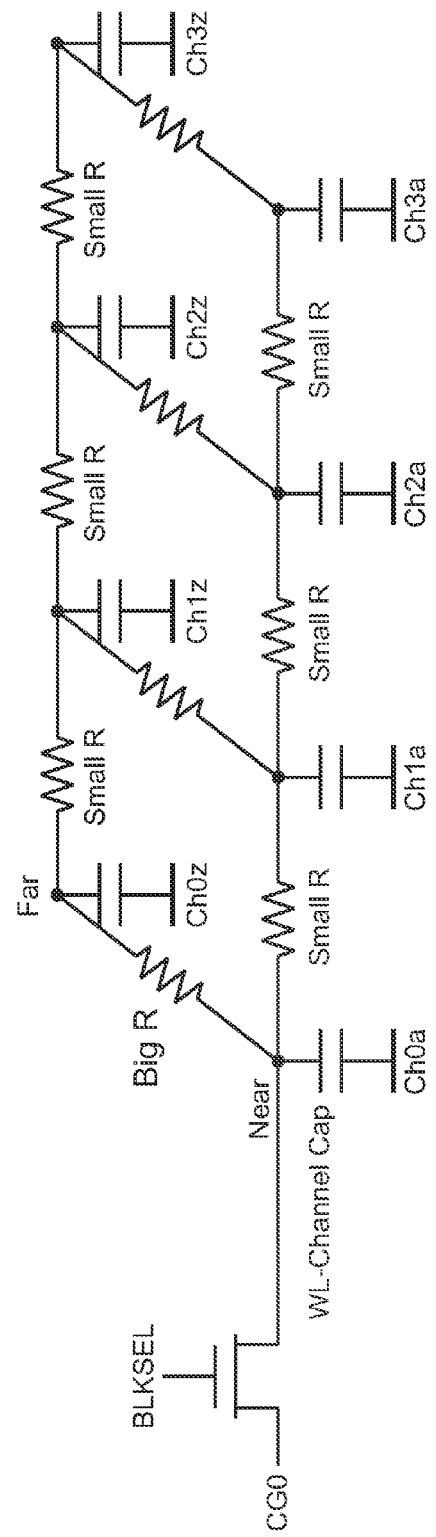
FIG. 39 is a schematic representation of driving a word line from one end in a BiCS type structure.

FIG. 39 is a schematic representation of the word line resistance and capacitance structure similar to FIG. 36A, but for the multi-fingered block structure. Looking at the portion from CG to the notation "near", followed a right turn out to the notation "far" is the same as FIG. 36A for the first finger. The word lines in the other fingers then run parallel to this first fingers word line in the oblique direction. The connections, moving right to left, between these fingers is the shorting together of the word lines at the near and far end of a common layer. The resistance of the connections between the fingers is relatively low, while the resistance between the near and far end of the word lines on each of the figures is relatively high. This sort of structure is then repeated for each word line layer of a block, where memory cells along the word lines from the different layers are connected along the NAND strings. The channel resistance along the NAND strings between these layers will also be small for the unselected fingers of a selected block where the channel is left to float during a programming operation.

The low resistance along the channel of the non-selected sub-block, or finger, together with the low resistance between the finger on the near and far ends allows for a non-selected word line to be used to apply a kick during a programming operation. In the example embodiment, this is done through the dummy word lines, as illustrated with respect to FIG. 40.

Figure 40:
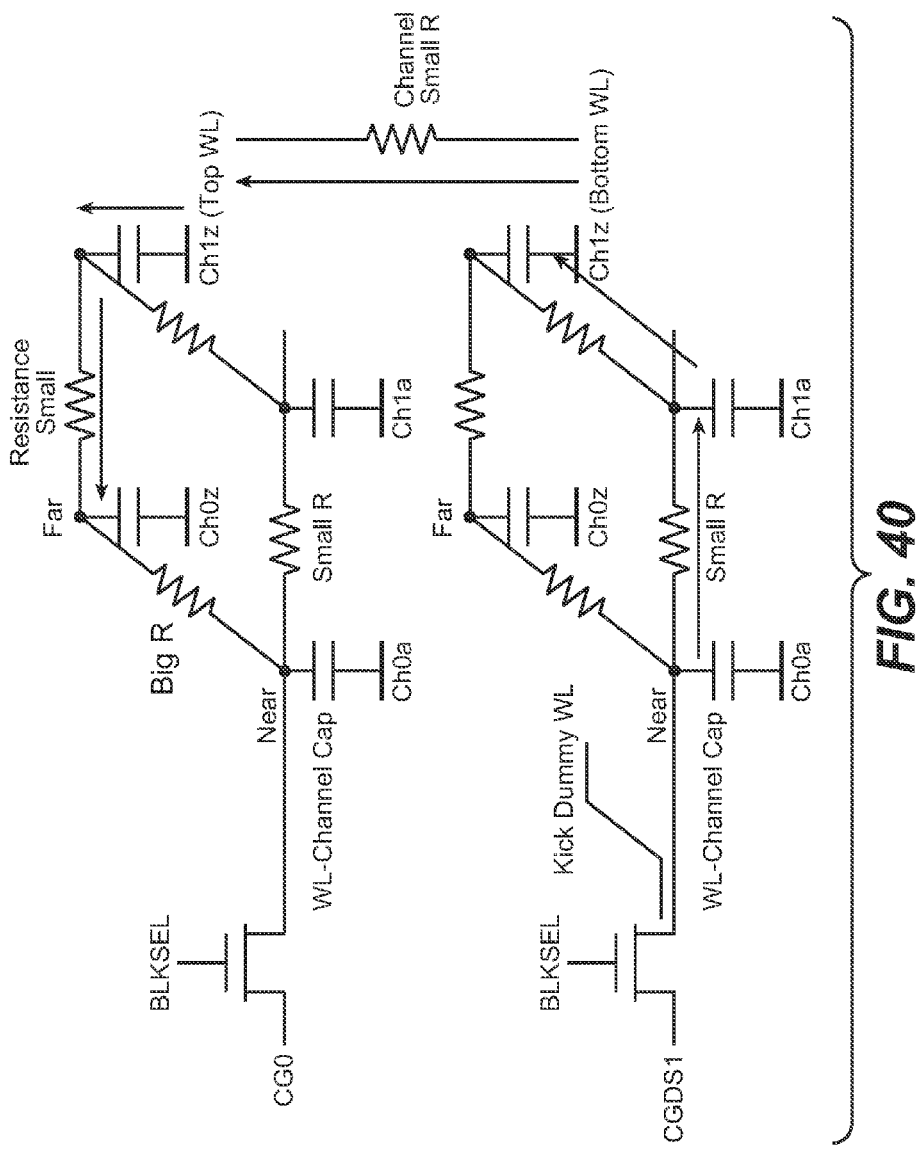
FIG. 40 is a schematic representation of how to apply a kick using dummy word lines though the non-selected finger of a selected block.

Similarly to FIG. 39, FIG. 40 shows two of the fingers for a first word line layer WL0 driven by level CG0 and a source side dummy word line WLDS1 driven by the level CGDS1, where the other fingers and other word line layers are not explicitly shown. For the unselected figures, the channels are floating. Consequently, when WL0 for the first finger is selected for programming, while the programming pulse is applied at CG0, a kick can also be applied at CGDS1. As shown by the arrows, this kick will travel along the low resistance between figures at the near end, travel out WLDS1 and up the channel of the non-selected finger to the far end, and then along the low resistance between figures at the far end to provide a kick at the far end of the selected word line.

Dummy word lines are typically included on one or both ends of the NAND structure, between word lines used storing user data (including system data) and the select gates. Although cells along a user word line may be written to any of the data states, including that with the highest threshold, dummy word lines are typically written to some lower level. Consequently, the dummy word lines have lower Vt (threshold voltage) than the unselected word lines that are programmed to the higher states. So in order to create a channel, a lower voltage ("VGP") can be used on the dummy cells, instead of the VPASS voltage typically used for non-selected (user) word lines. Additionally, in terms of boosting, the dummy word lines are usually far away from the selected word line and have less effect on boosting the channel that is directly below the selected WL.

Figure 41:
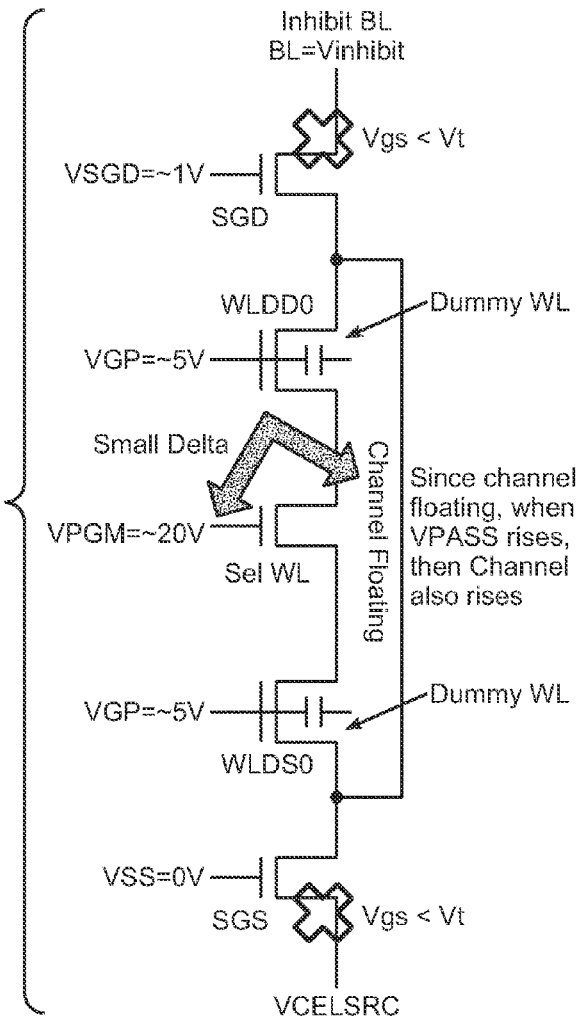
FIG. 41 shows a detail of the dummy word line and selected word line voltages during programming.
Figure 42:
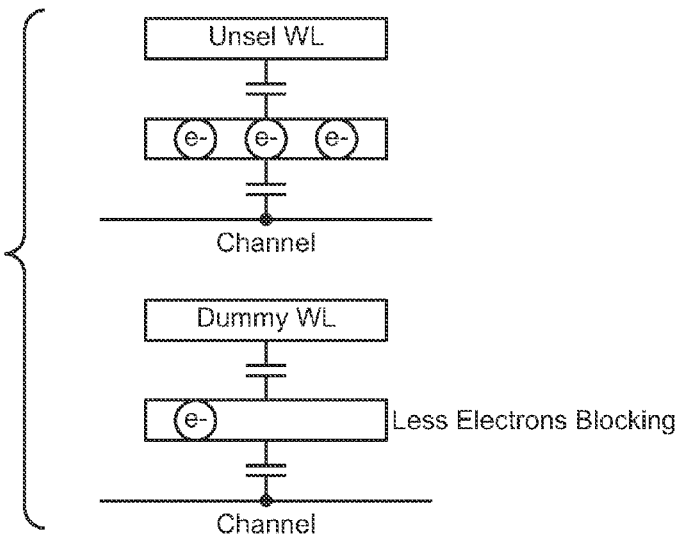
FIG. 42 illustrates how dummy word lines can have a lower Vt than a highly programmed non-selected word line.

This is illustrated in FIGS. 41 and 42. FIG. 41 is similar to FIG. 35A, but with only the selected word line (receiving VPGM) and a dummy word line on either end being shown. FIG. 41 is for case of a program inhibited word line in the selected finger of a block, where the NAND string is cut off on the drain side by having the program inhibit voltage on the bit line. For a non-selected finger of the selected block, the drain side select gate will cut off the NAND string independently of the bit line level. In either case, the channel will be floating since, for the channel to conduct, the dummy word lines need only be at the lower VGP (5V, for example) instead of the VPASS level (10V, for example). As the channel is floating, when any of the word line voltages rise, the channel also rises. The reason that dummy word lines have a lower Vt than a highly programmed non-selected word line is illustrated schematically in FIG. 42: at top, the charge storage region of the unselected cell will have more electron blocking; at bottom, the dummy word line has fewer electrons in the charge storage reason and less electron blocking.

The example embodiment applies the kick to dummy word lines, as a relative large voltage kick can be applied to a dummy word line as it is at a relatively low voltage at the beginning of programming pulse. This is different than is typical for non-selected data word lines, which are usually biased at a high voltage level like VPASS, for example, where any extra higher voltage may cause program disturb. Additionally, as the dummy word lines hold non-user dummy data, any relatively minor disturb that may occur will not affect user data. In alternate embodiment, non-dummy unselected word lines can be used for the kick, if the likelihood of disturb is low or the amount of disturb is otherwise acceptable. For example, in some NAND programming algorithms, non-selected word lines that are somewhat distant are set to a lower voltage than the pass voltage applied to word lines near the selected word line, providing a more localized channel boosting. The non-selected data word lines at the lower voltage could then be employed for providing a kick, while still having a lower likelihood of disturb.

Figure 43:
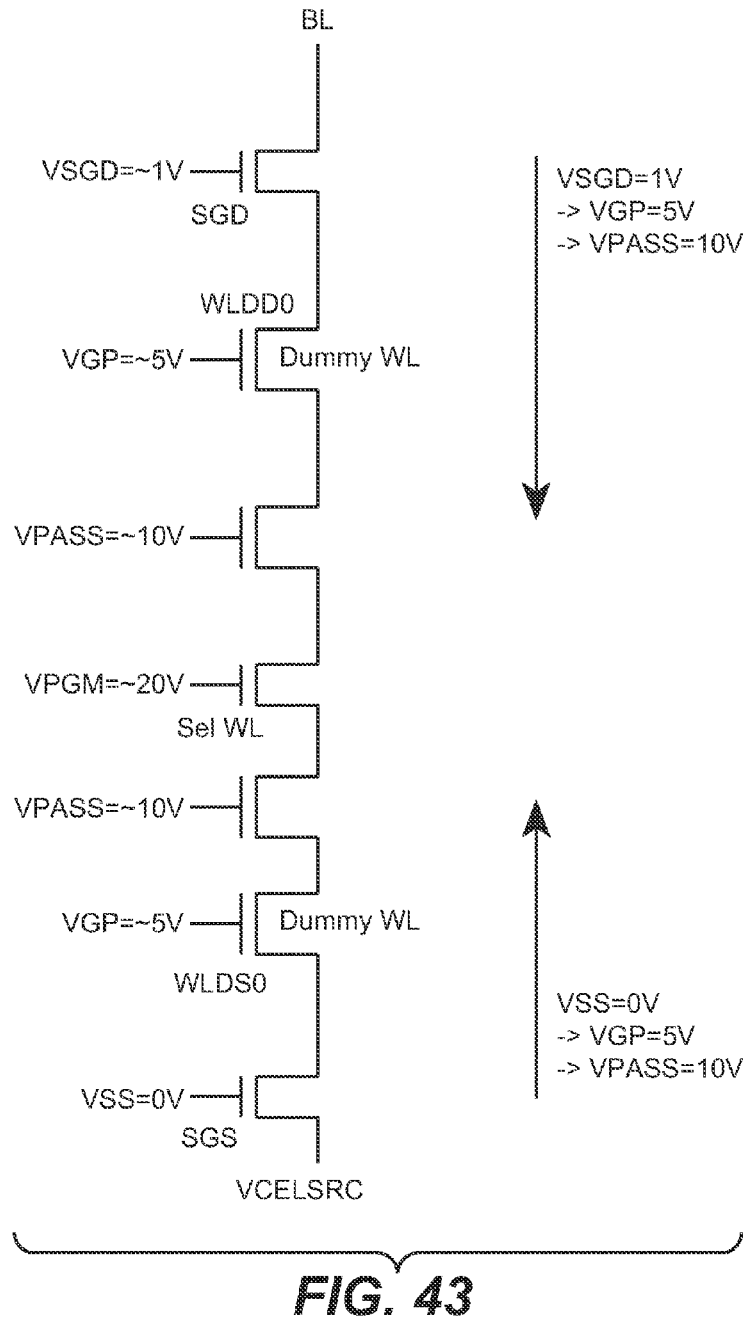
FIG. 43 looks further at the use of lower bias voltage on dummy word lines.

FIG. 43 looks another reason the dummy word line can be biased to a lower voltage, which is to have a gradual change of gate voltage bias on subsequent word lines. This will help reduce stress. For a dummy word line kick, the dummy word line bias is set to a lower voltage initially and only raises to higher voltage like VPASS near the end of program pulse. As such, it is not at a high voltage like VPASS from beginning of program pulse. As can be seen by the top arrow, there is a gradual change from drain side select gate biasing from VSGD=1V to VGP=5V and then to VPASS=10V. Similarly, on the source side, there is a gradual change from select gate biasing at VSS=0V to VGP=5V and then to VPASS=10V.

Returning to the example embodiment, as all data word lines will only couple up by the word line to channel coupling ratio, program disturb can be minimal. Use of dummy word lines means that the far side can rise much faster as it can receive a bigger kick than for a data word line without unacceptable amounts of disturb. Additionally, the rise time of a dummy word line kick can be slow enough so that the near side of the word line will be held strongly, avoiding overshoot. Also, as the example embodiment applies the kick at the end of the programming pulse, this will draw less peak current than if it were done at the same time as when all of the non-selected word lines are charging up.

Figure 44:
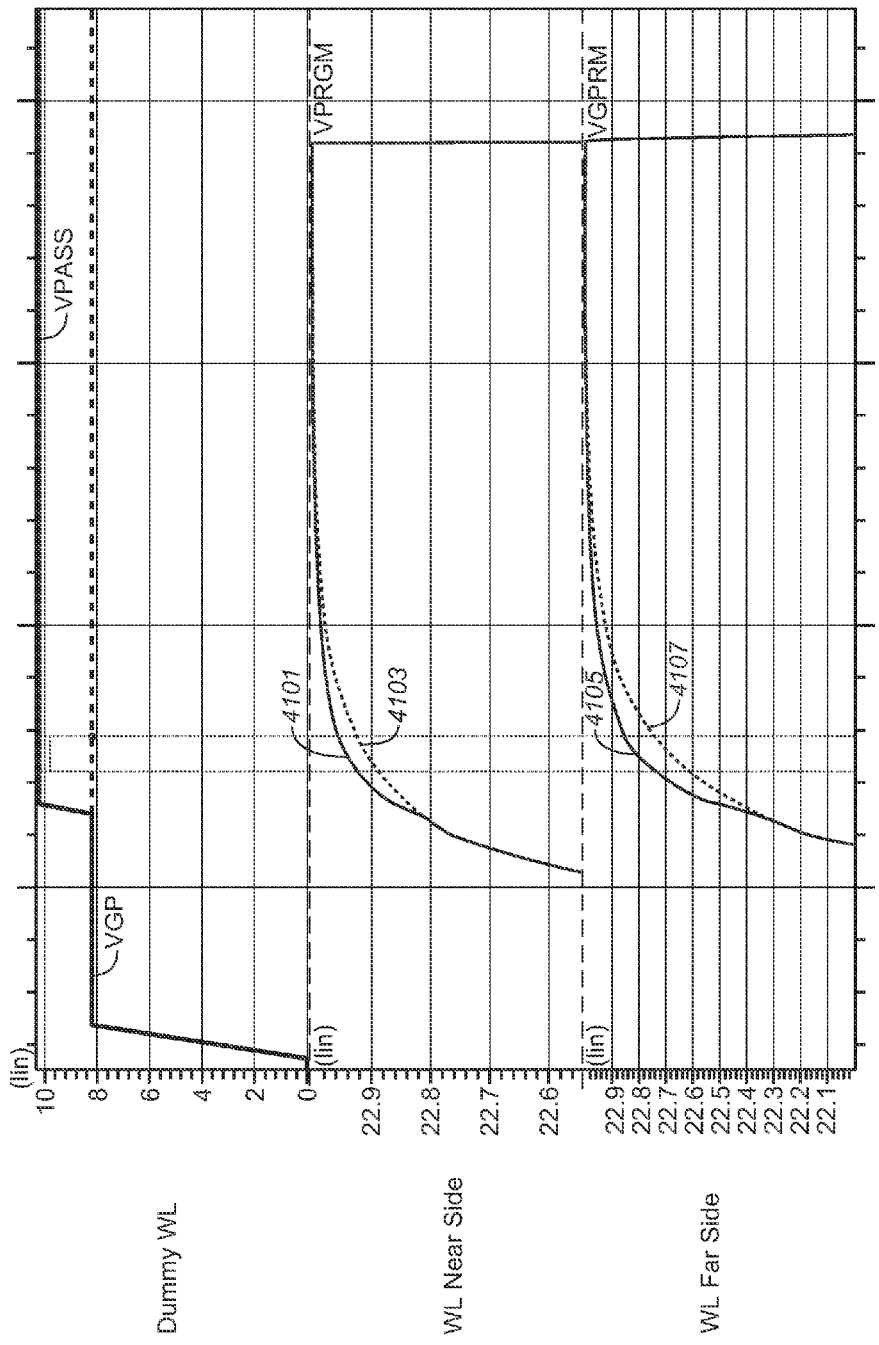
FIG. 44 shows some waveforms for a dummy word line with kick at top, the selected word line's near side in the middle, and the selected word line's far side at bottom.

FIG. 44 shows some waveforms for a dummy word line with kick at top, the selected word line's near side in the middle, and the selected word line's far side at bottom. (Note the difference in vertical axis, which is relatively magnified for the selected word line traces, only showing the upper part of the pulse.) The dummy word line ramps up at the same time at the other non-selected word lines (not shown) and the other bias levels are set. The dummy word line is initially set to VGP, lower than the usual VPASS levels on the other non-selected word lines. The programming pulse is then applied to the near side of the selected word line, during which the kick is applied to the dummy word line. In this example, the dummy word line is raised from VGP=~8V to a VPASS=~10V. On the near side, the effect of the kick is shown at 4101, where 4103 is the rise without the kick. On the far, the effect is shown at 4105, relative to the non-kick rise of 4107. The far side kicks up more than the near side because the word lines are more strongly held at the driven near side. As shown, the far side rise time is reduced noticeably.

The raising of the dummy (or other) word line to provide a kick can be accomplished in various ways. The DAC input of the VGP generator can be set higher to generate a higher voltage for VGP from the driver. Alternately, the dummy word line can be set to VPASS, where VPASS>VGP. Typically, the memory will not set the dummy word line to higher than VPASS to minimize program disturb. If program disturb is not an issue, then the memory can set the dummy word line higher than VPASS and get more boosting.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A non-volatile memory circuit, comprising:
   an array having a plurality of blocks formed according to a NAND type of architecture of a plurality of non-volatile memory cells formed along word lines and connected in series between select gates, each of the blocks having a plurality of sub-blocks, where individual word line portions of the sub-blocks of the same word line of the same block are commonly connected and the select gates of control gates of sub-blocks are connected independently of the select gates of other sub-blocks of the same block;
   driver circuitry connectable to the word lines and the select gates to provide programming voltage levels thereto, wherein the driver circuitry is connectable at a first, but not a second, end of each of the word lines, and wherein at the second end thereof each of the individual word line portions of sub-blocks of the same word line of a block are commonly connected;
   decoding circuitry by which the driver circuitry is connectable to the word lines and the select gates; and
   on-chip control circuitry connected to the driver circuit and decoder circuitry, whereby when performing a programming operation for memory cells on a selected word line for a selected sub-block of a selected block: an initial block biasing operation of the selected block is performed in which select gates of non-selected sub-blocks of the selected block are biased to be off and non-selected word lines of the selected block are biased to one of one or more pass voltages, except for a first set of one or more non-selected word lines that are set to a first voltage level, wherein the pass voltages are sufficient to allow a memory cell to conduct independently of a data state written thereto and wherein the first voltage will allow a memory cell to conduct for some but not all data states programmable thereto; and, with the selected block biased according to the initial block biasing operation, applying a programming pulse to the selected word line and, while applying the programming pulse, raising the voltage level on one or more of the first set of word lines from the first voltage to a pass voltage.

2. The non-volatile memory circuit of claim 1, wherein the array includes word lines storing user data and one or more dummy word lines not used for the storing of user data, the memory cells of the dummy word lines formed between the memory cells of word lines storing user data and a select gate, wherein the first set of non-selected word lines includes one or more dummy word lines.

3. The non-volatile memory circuit of claim 2, wherein the first set of non-selected word lines includes a source-side dummy word lines.

4. The non-volatile memory circuit of claim 2, wherein the first set of non-selected word lines includes a drain-side dummy word lines.

5. The non-volatile memory circuit of claim 1, wherein the memory circuit is a monolithic three-dimensional semiconductor memory device having the memory cells arranged in multiple physical levels above a silicon substrate and comprising a charge storage medium, wherein NAND strings run in a vertical direction relative to the substrate, and wherein the word lines run in a horizontal direction relative to the substrate.

6. A method of performing a programming operation for memory cells on a selected word line for a selected sub-block of a selected block of a non-volatile memory circuit, the memory circuit having an array having of a plurality of blocks formed according to a NAND type of architecture of a plurality of non-volatile memory cells formed along word lines and connected in series between select gates, each of the blocks having a plurality of sub-blocks, where individual word line portions of the sub-blocks of the same word line of the same block are commonly connected and the select gates of control gates of sub-blocks are connected independently of the select gates of other sub-blocks of the same block, and having driver circuitry connectable to the word lines and the select gates to provide programming voltage levels thereto, wherein the driver circuitry is connectable at a first, but not a second, end of each of the word lines, and wherein at the second end thereof each of the individual word line portions of sub-blocks of the same word line of a block are commonly connected, the method comprising:

performing an initial block biasing operation of the selected block, comprising:
  biasing select gates of non-selected sub-blocks of the selected block to be off; and
  driving from the first end thereof non-selected word lines of the selected block, where the non-selected word lines of the selected block are biased to one of one or more pass voltages, except for a first set of one or more non-selected word lines that are set to a first voltage level, wherein the pass voltages are sufficient to allow a memory cell to conduct independently of a data state written thereto and wherein the first voltage will allow a memory cell to conduct for some but not all data states programmable thereto; and,
with the selected block biased according to the initial block biasing operation, applying a programming pulse to the selected word line from the first end thereof; and
while applying the programming pulse, raising the voltage level on one or more of the first set of word lines from the first voltage to a pass voltage.

7. The method of claim 6, wherein the array includes word lines storing user data and one or more dummy word lines not used for the storing of user data, the memory cells of the dummy word lines formed between the memory cells of word lines storing user data and a select gate, wherein the first set of non-selected word lines includes one or more dummy word lines.

8. The method of claim 7, wherein the first set of non-selected word lines includes a source-side dummy word lines.

9. The method of claim 7, wherein the first set of non-selected word lines includes a drain-side dummy word lines.

10. The method of claim 6, wherein the memory circuit is a monolithic three-dimensional semiconductor memory device having the memory cells arranged in multiple physical levels above a silicon substrate and comprising a charge storage medium, wherein NAND strings run in a vertical direction relative to the substrate, and wherein the word lines run in a horizontal direction relative to the substrate.

11. A non-volatile memory circuit, comprising:
  an array having a plurality of blocks formed according to a NAND type of architecture of a plurality of non-volatile memory cells formed along word lines and connected in series between select gates, each of the blocks having a plurality of sub-blocks, where individual word line portions of the sub-blocks of the same word line of the same block are commonly connected and the select gates of control gates of sub-blocks are connected independently of the select gates of other sub-blocks of the same block, wherein the memory circuit is a monolithic three-dimensional semiconductor memory device having the memory cells arranged in multiple physical levels above a silicon substrate and comprising a charge storage medium, wherein NAND strings run in a vertical direction relative to the substrate, and wherein the word lines run in a horizontal direction relative to the substrate;
  driver circuitry connectable to the word lines and the select gates to provide programming voltage levels thereto, wherein the driver circuitry is connectable at a first, but not a second, end of each of the word lines, and wherein at the second end thereof each of the individual word line portions of sub-blocks of the same word line of a block are commonly connected;
  decoding circuitry by which the driver circuitry is connectable to the word lines and the select gates; and
  on-chip control circuitry connected to the driver circuit and decoder circuitry, whereby when performing a programming operation for memory cells on a selected word line for a selected sub-block of a selected block: an initial block biasing operation of the selected block is performed in which select gates of non-selected sub-blocks of the selected block are biased to be off and non-selected word lines of the selected block are biased to one of one or more pass voltages, except for a first set of one or more non-selected word lines that are set to a first voltage level, wherein the pass voltages are sufficient to allow a memory cell to conduct independently of a data state written thereto and wherein the first voltage will allow a memory cell to conduct for some but not all data states programmable thereto; and, with the selected block biased according to the initial block biasing operation, applying a programming pulse to the selected word line and, while applying the programming pulse, raising the voltage level on one or more of the first set of word lines from the first voltage to a pass voltage.

12. The non-volatile memory circuit of claim 11, wherein the array includes word lines storing user data and one or more dummy word lines not used for the storing of user data, the memory cells of the dummy word lines formed between the memory cells of word lines storing user data and a select gate, wherein the first set of non-selected word lines includes one or more dummy word lines.

13. The non-volatile memory circuit of claim 12, wherein the first set of non-selected word lines includes a source-side dummy word lines.

14. The non-volatile memory circuit of claim 12, wherein the first set of non-selected word lines includes a drain-side dummy word lines.

* * * * *